(12) United States Patent
Murakami et al.

(10) Patent No.: US 7,545,424 B2
(45) Date of Patent: Jun. 9, 2009

(54) SHIFT REGISTER AND MOS-TYPE SOLID-STATE IMAGE SENSOR

(75) Inventors: Masashi Murakami, Soraku-gun (JP); Yoshiyuki Matsunaga, Kamakura (JP); Masayuki Masuyama, Nagaokakyo (JP)

(73) Assignee: Panasonic Corporation, Osaka (JP)

( * ) Notice: Subject to any disclaimer, the term of this patent is extended or adjusted under 35 U.S.C. 154(b) by 708 days.

(21) Appl. No.: 11/035,201

(22) Filed: Jan. 14, 2005

(65) Prior Publication Data

US 2005/0167705 A1 Aug. 4, 2005

(30) Foreign Application Priority Data

Jan. 30, 2004 (JP) .............................. 2004-024377

(51) Int. Cl.
*H04N 5/335* (2006.01)
(52) U.S. Cl. ...................................... 348/308; 348/294
(58) Field of Classification Search ................ 348/294, 348/308; 377/61, 50, 59, 62, 58, 63, 72, 377/79
See application file for complete search history.

(56) References Cited

U.S. PATENT DOCUMENTS 6,295,046 B1 * 9/2001 Hebiguchi ................... 345/100
2004/0234020 A1 * 11/2004 Yu .............................. 377/64

FOREIGN PATENT DOCUMENTS

| JP | 05-030278 |   | 2/1993 |
|----|-----------|---|--------|
| JP | 06-202588 | * | 7/1994 |
| JP | 11-86586  |   | 3/1999 |
| JP | 2001-052494 A |   | 2/2001 |
| JP | 2001-060398 A |   | 3/2001 |
| JP | 2001-273785 A |   | 10/2001 |
| JP | 2002-055660 A |   | 2/2002 |
| JP | 2003-309768 A |   | 10/2003 |

* cited by examiner

*Primary Examiner*—Sinh N Tran
*Assistant Examiner*—Paul Berardesca
(74) *Attorney, Agent, or Firm*—McDermott Will & Emery LLP

(57) ABSTRACT

An object of the present invention is to provide a shift register in which it is prevented from malfunctioning because of a portion between a first transistor and a second transistor being in a high-impedance state. The shift register of the present invention includes capacitor means 5 for storing data outputted from a unit circuit 1 of the preceding block. A first transistor 3 is turned ON only when data is being stored in the capacitor means 5. A second transistor 7 includes a control electrode and an input-side diffusion layer connected to the output-side diffusion layer of the first transistor 3, and is turned ON only when a pulse of a clock signal from the first transistor 3 is inputted to the control electrode and the input-side diffusion layer. Potential controlling means 2 keeps the second transistor 7 OFF at least during a period in which the second transistor 7 is supposed to be OFF.

10 Claims, 15 Drawing Sheets

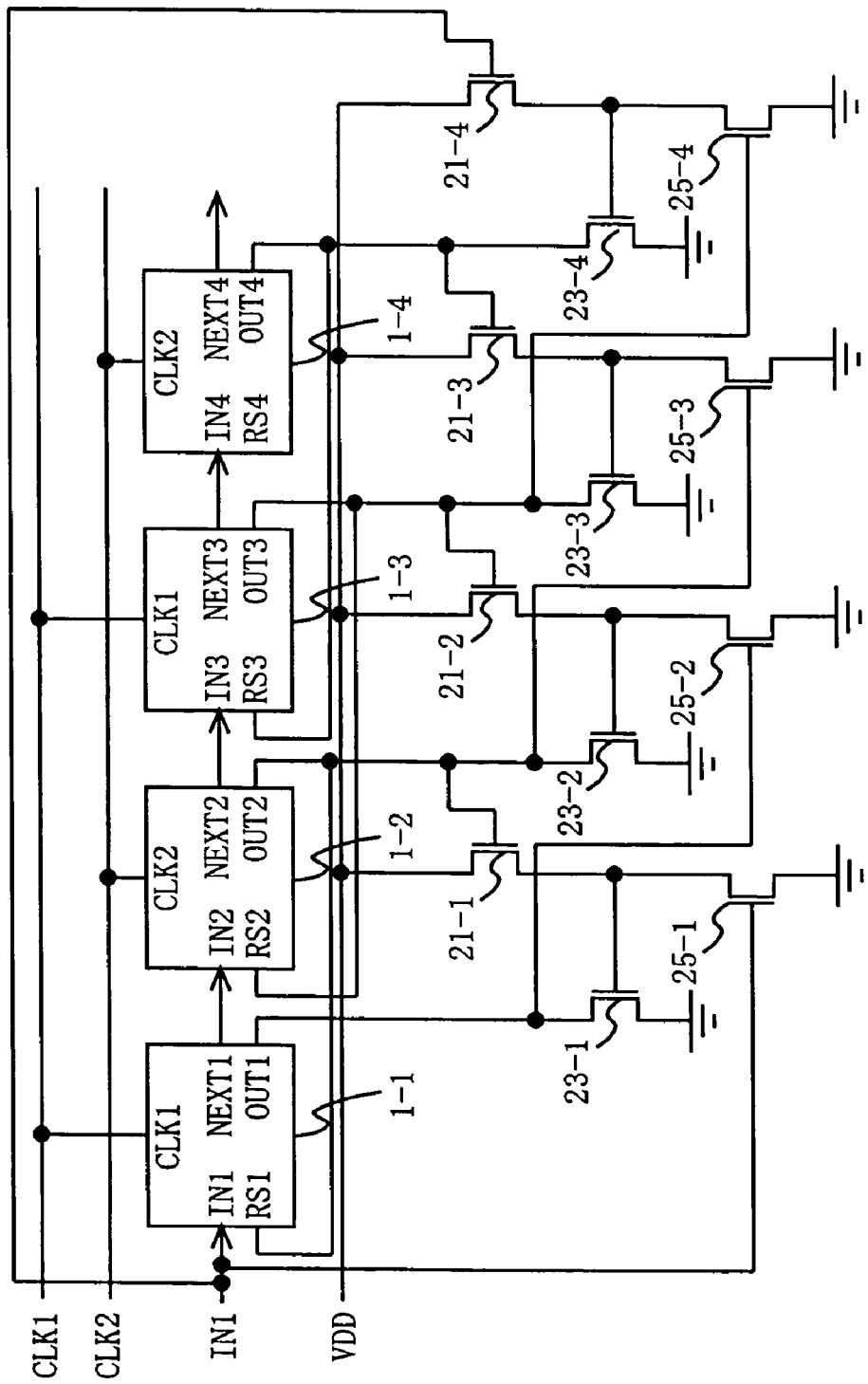
F I G. 6

US 7,545,424 B2

SHIFT REGISTER AND MOS-TYPE SOLID-STATE IMAGE SENSOR

BACKGROUND OF THE INVENTION

1. Field of the Invention

The present invention relates to a shift register, and more particularly to a shift register including a plurality of blocks of unit circuits for transferring data in one direction based on a clock signal having pulses.

2. Description of the Background Art

A conventional shift register will now be described. FIG. 16 shows a configuration of the conventional shift register.

Referring to FIG. 16, the shift register includes four blocks of unit circuits 1-1 to 1-4 and transfers data from left to right in FIG. 16 based on two clock signals CLK1 and CLK2 having a predetermined period. The clock signals CLK1 and CLK2 are signals having pulses that appear with the same period but in an alternating manner. A unit circuit 1 outputs an output signal NEXT (i.e., data being transferred) to another unit circuit 1 of an adjacent block downstream in the data transfer direction (hereinafter referred to as the "subsequent block"), and outputs an output signal OUT at the same time. The output signal OUT serves as a reset signal RS for erasing data stored in another unit circuit 1 of an adjacent block upstream in the data transfer direction (hereinafter referred to as the "preceding block"). The output signal NEXT serves as an input signal IN to the unit circuit 1 of the subsequent block. Referring to FIG. 17, the unit circuit 1 will now be described in greater detail. FIG. 17 is a circuit diagram showing a detailed configuration of the unit circuit 1.

First, the circuit configuration of the unit circuit 1 will be described. Referring to FIG. 17, the unit circuit 1 includes a transistor 3, a capacitor 5, a transistor 7 and a transistor 9. The drain of the transistor 3 is connected to the signal line of the clock signal CLK1, and the clock signal CLK1 is received via the drain of the transistor 3. The input signal IN is applied to the gate of the transistor 3. The source of the transistor 3 is connected to the drain of the transistor 7. The source of the transistor 3 is also connected to the unit circuit 1 of the preceding block, and the output signal OUT is outputted via the source of the transistor 3.

The gate of the transistor 7 is connected to the drain of the transistor 7. The source of the transistor 7 is connected to the unit circuit 1 of the subsequent block, and the output signal NEXT is outputted via the source of the transistor 7. The capacitor 5 is connected between the gate and the source of the transistor 3.

The input signal IN is applied to the drain of the transistor 9. The reset signal RS is applied to the gate of the transistor 9. The source of the transistor 9 is grounded.

The functions of the components of the unit circuit 1 shown in FIG. 17 will now be described. The transistor 3 selectively outputs or does not output the clock signal based on the voltage value of the input signal IN applied to the gate thereof. Specifically, the transistor 3 outputs the clock signal CLK via the source thereof if the input signal IN has a voltage at a high level indicating data of "1". If the input signal IN has a voltage at a low level, the transistor 3 does not output the clock signal CLK via the source thereof. In such a case, the potential at the source of the transistor 3 is equal to the low level of the clock signal CLK.

The capacitor 5 serves to store data being transferred from the unit circuit 1 of the preceding block. The capacitor 5 may be a capacitor formed between the gate and the drain of the transistor 3 or a capacitor formed between the gate and the source of the transistor 3, or may be a separately-provided capacitor.

The transistor 7 is a switch that determines whether or not the clock signal CLK from the source of the transistor 3 is to be outputted as the output signal NEXT. Specifically, a voltage at the high level indicating data of "1" is outputted from the source of the transistor 7 as the output signal NEXT if a voltage at the high level is applied to the gate and the drain thereof. If a voltage at the low level is applied to the gate and the drain of the transistor 7, a voltage at the low level is outputted from the source thereof as the output signal NEXT.

The transistor 9 erases data stored in the capacitor 5 using the output signal OUT from the unit circuit 1 of the subsequent block as the reset signal RS. Thus, the transistor 9 serves to clear the data stored in the unit circuit 1 to which it belongs after the unit circuit 1 to which it belongs outputs the charge being transferred.

Referring to FIG. 18, the operation of the conventional shift register having such a configuration will now be described. FIG. 18 shows voltage transitions of various signals when the conventional shift register is transferring data.

At t=0, the unit circuit 1-1 receives data to be transferred. Specifically, the unit circuit 1-1 receives the input signal IN1 having a voltage at the high level. The data is stored in the capacitor 5 of the unit circuit 1-1, and the gate potential of the transistor 3 of the unit circuit 1-1 increases to the high level. As a result, the transistor 3 of the unit circuit 1-1 is turned ON.

At t=2, the voltage of the clock signal CLK1 transitions to the high level. Since the transistor 3 of the unit circuit 1-1 is ON, the transistor 3 outputs the clock signal CLK1 having a voltage at the high level via the source thereof. Thus, the voltage of the output signal OUT1 increases to the high level. Moreover, the gate potential of the transistor 3 of the unit circuit 1-1 (i.e., the voltage of the input signal IN1) increases.

Moreover, at t=2, a voltage at the high level is applied to the gate and the drain of the transistor 7 of the unit circuit 1-1. Thus, the transistor 7 of the unit circuit 1-1 is turned ON. As a result, the voltage of the output signal NEXT1 increases to the high level. Thus, data is transferred from the unit circuit 1-1 to the unit circuit 1-2.

At t=3, the voltage of the clock signal CLK1 decreases to the low level. Accordingly, the voltage of the output signal OUT1 also decreases to the low level. Similarly, the gate potential of the transistor 3 of the unit circuit 1-1 (i.e., the voltage of the input signal IN1) decreases.

Moreover, at t=3, as the voltage of the clock signal CLK1 decreases to the low level, the gate potential and the drain potential of the transistor 7 of the unit circuit 1-1 also decrease. As a result, the transistor 7 of the unit circuit 1-1 is turned OFF.

At t=4, the voltage of the clock signal CLK2 transitions to the high level. Since the transistor 3 of the unit circuit 1-2 is ON, the transistor 3 outputs the clock signal CLK2 having a voltage at the high level via the source thereof. Thus, the voltage of the output signal OUT2 increases to the high level. Moreover, the gate potential of the transistor 3 of the unit circuit 1-2 (i.e., the voltage of the input signal IN2) increases.

The output signal OUT2 is used as the reset signal RS1 for the unit circuit 1-1. Therefore, as the voltage of the output signal OUT2 increases, the voltage of the reset signal RS1 also increases, thus clearing data stored in the capacitor 5 of the unit circuit 1-1. As a result, the gate potential of the transistor 3 of the unit circuit 1-1 (i.e., the voltage of the input signal IN1) decreases to the low level.

Moreover, at t=4, the clock signal CLK2 at the high level is applied to the gate and the drain of the transistor 7 of the unit circuit 1-2. Thus, the transistor 7 of the unit circuit 1-2 is turned ON. As a result, the voltage of the output signal NEXT2 increases to the high level. Thus, data is transferred from the unit circuit 1-2 to the unit circuit 1-3.

At t=5, the voltage of the clock signal CLK2 decreases to the low level. Accordingly, the voltage of the output signal OUT2 also decreases to the low level. Similarly, the gate potential of the transistor 3 of the unit circuit 1-2 (i.e., the voltage of the input signal IN2) decreases.

Moreover, at t=5, as the voltage of the clock signal CLK2 decreases to the low level, the gate potential and the drain potential of the transistor 7 of the unit circuit 1-2 also decrease. As a result, the transistor 7 of the unit circuit 1-2 is turned OFF.

At t=6, the voltage of the clock signal CLK1 transitions to the high level. Since the transistor 3 of the unit circuit 1-3 is ON, the transistor 3 outputs the clock signal CLK1 having a voltage at the high level via the source thereof. Thus, the voltage of the output signal OUT3 increases to the high level. Moreover, the gate potential of the transistor 3 of the unit circuit 1-3 (i.e., the voltage of the input signal IN3) increases.

The output signal OUT3 is used as the reset signal RS2 for the unit circuit 1-2. Therefore, as the voltage of the output signal OUT3 increases, the voltage of the reset signal RS2 also increases, thus clearing data stored in the capacitor 5 of the unit circuit 1-2. As a result, the gate potential of the transistor 3 of the unit circuit 1-2 (i.e., the voltage of the input signal IN2) decreases to the low level.

Moreover, at t=6, the clock signal CLK1 at the high level is applied to the gate and the drain of the transistor 7 of the unit circuit 1-3. Thus, the transistor 7 of the unit circuit 1-3 is turned ON. As a result, the voltage of the output signal NEXT3 increases to the high level. Thus, data is transferred from the unit circuit 1-3 to the unit circuit 1-4.

At t=7, the voltage of the clock signal CLK1 decreases to the low level. Accordingly, the voltage of the output signal OUT3 also decreases to the low level. Similarly, the gate potential of the transistor 3 of the unit circuit 1-3 (i.e., the voltage of the input signal IN3) decreases.

Moreover, at t=7, as the voltage of the clock signal CLK1 decreases to the low level, the gate potential and the drain potential of the transistor 7 of the unit circuit 1-3 also decrease. As a result, the transistor 7 of the unit circuit 1-3 is turned OFF.

At t=8, the voltage of the clock signal CLK2 transitions to the high level. Since the transistor 3 of the unit circuit 1-4 is ON, the transistor 3 outputs the clock signal CLK2 having a voltage at the high level via the source thereof. Thus, the voltage of the output signal OUT4 increases to the high level. Moreover, the gate potential of the transistor 3 of the unit circuit 1-4 (i.e., the voltage of the input signal IN4) increases.

Moreover, at t=8, the clock signal CLK2 at the high level is applied to the gate and the drain of the transistor 7 of the unit circuit 1-4. Thus, the transistor 7 of the unit circuit 1-4 is turned ON. As a result, the voltage of the output signal NEXT3 increases to the high level. Thus, data is outputted from the unit circuit 1-4.

The conventional shift register shown in FIG. 16 transfers data from left to right through an operation as described above.

Various methods for transferring data by a shift register are known in the art, e.g., the method disclosed in Japanese Laid-Open Patent Publication No. 2001-273785.

The conventional shift register as described above has a problem in that a portion of the unit circuit 1-1 between the source of the transistor 3 and the gate of the transistor 7 (i.e., the portion via which the output signal OUT1 is outputted) is in a high-impedance state during the period (α) in FIG. 18. This will be explained in detail below.

During the period (α) in FIG. 18, the voltage of the input signal IN1 applied to the gate of the transistor 3 is at the low level. Therefore, the transistor 3 is OFF. Since the transistor 3 is OFF, the voltage of the output signal OUT1, being equal to the gate potential of the transistor 7, is also at the low level. Thus, the transistor 7 is also OFF. As a result, the portion between the source of the transistor 3 and the gate of the transistor 7 is in a high-impedance state.

If the portion between the source of the transistor 3 and the gate of the transistor 7 is in a high-impedance state as described above, the potential at this portion and the voltage of the output signal OUT1 will not stably stay at the low level during the period (α). This may result in, for example, the transistor 7, which should be turned OFF, being erroneously turned ON, thereby causing a malfunction of the shift register.

SUMMARY OF THE INVENTION

Therefore, an object of the present invention is to provide a shift register in which it is prevented from malfunctioning because of a portion between a first transistor and a second transistor being in a high-impedance state.

A shift register of the present invention includes a plurality of blocks of unit circuits for transferring data in one direction based on a clock signal having pulses. Each unit circuit includes capacitor means, a first transistor, a second transistor and potential controlling means. The capacitor means stores the data outputted from an adjacent unit circuit upstream in a data transfer direction. The first transistor includes an input-side diffusion layer and an output-side diffusion layer, wherein the first transistor receives a clock signal via the input-side diffusion layer, and the first transistor is turned ON only when the data is being stored in the capacitor means so as to output a pulse of the clock signal via the output-side diffusion layer. The second transistor includes a control electrode, an input-side diffusion layer and an output-side diffusion layer, wherein the control electrode and the input-side diffusion layer are connected to the output-side diffusion layer of the first transistor, and the second transistor is turned ON only when the pulse of the clock signal from the first transistor is inputted to the control electrode and the input-side diffusion layer so as to output the data via the output-side diffusion layer to an adjacent unit circuit downstream in the data transfer direction. The potential controlling means controls a potential at the control electrode of the second transistor to be such a potential that the second transistor is kept OFF at least during a period in which the second transistor is supposed to be OFF. Note that the terms "input-side diffusion layer", "output-side diffusion layer" and "control electrode" as used in the claims refer to a "drain", a "source" and a "gate" as used in the description of the preferred embodiments, respectively. This applies because N-channel transistors are used in the embodiments of the present invention. If P-channel transistors are used, the relationship between the input-side diffusion layer and the output-side diffusion layer is reversed.

In a preferred embodiment, each unit circuit further includes erasing means for erasing the data stored in the capacitor means after the data is outputted from the unit circuit.

In a preferred embodiment, the erasing means is a third transistor including a control electrode, an input-side diffusion layer and an output-side diffusion layer, wherein a predetermined voltage is applied to the output-side diffusion layer, the input-side diffusion layer is connected to the control electrode of the first transistor, and the control electrode is connected to a portion of an adjacent unit circuit downstream in the data transfer direction between the output-side diffusion layer of the first transistor and the control electrode of the second transistor; and the third transistor is turned ON when a pulse of the clock signal is outputted from the output-side diffusion layer of the first transistor included in the adjacent unit circuit downstream in the data transfer direction so as to erase the data stored in the capacitor means. Note that the predetermined voltage applied to the output-side diffusion layer of the third transistor is the ground potential if the third transistor is an N-channel MOS transistor, and is a positive potential if the third transistor is a P-channel MOS transistor.

In a preferred embodiment, the potential controlling means is a resistor having one end connected to a portion between the output-side diffusion layer of the first transistor and the control electrode of the second transistor, and the other end to which a predetermined voltage is applied.

In a preferred embodiment, the potential controlling means is a fourth transistor including a control electrode, an input-side diffusion layer and an output-side diffusion layer, wherein the input-side diffusion layer is connected to a portion between the output-side diffusion layer of the first transistor and the control electrode of the second transistor, a predetermined voltage is applied to the output-side diffusion layer, and a DC voltage of a constant level is applied to the control electrode.

In a preferred embodiment, the potential controlling means includes a fifth transistor including a control electrode, an input-side diffusion layer and an output-side diffusion layer, wherein the input-side diffusion layer is connected to a portion between the output-side diffusion layer of the first transistor and the control electrode of the second transistor, a predetermined voltage is applied to the output-side diffusion layer, and a control signal for turning ON/OFF the fifth transistor is applied to the control electrode; and the fifth transistor is controlled by the control signal so that the fifth transistor is ON during a period in which the first transistor and the second transistor are OFF after the data is outputted to an adjacent unit circuit downstream in the data transfer direction.

In a preferred embodiment, the potential controlling means includes control signal producing means for producing the control signal by using a pulse of the clock signal outputted from the output-side diffusion layer of the first transistor included in the adjacent unit circuit downstream in the data transfer direction.

In a preferred embodiment, the control signal producing means is a sixth transistor including a control electrode, an input-side diffusion layer and an output-side diffusion layer, wherein the input-side diffusion layer and the control electrode are connected to the output-side diffusion layer of the first transistor included in the adjacent unit circuit downstream in the data transfer direction, and the output-side diffusion layer is connected to the control electrode of the fifth transistor; the sixth transistor is turned ON when a pulse of the clock signal outputted from the first transistor included in the adjacent unit circuit downstream in the data transfer direction is applied to the control electrode and the input-side diffusion layer of the sixth transistor; and the fifth transistor is turned ON when the sixth transistor is turned ON.

In a preferred embodiment, the control signal producing means is a sixth transistor including a control electrode, an input-side diffusion layer and an output-side diffusion layer, wherein the control electrode is connected to the output-side diffusion layer of the first transistor included in the adjacent unit circuit downstream in the data transfer direction, the output-side diffusion layer is connected to the control electrode of the fifth transistor, and a predetermined DC voltage is applied to the input-side diffusion layer; the sixth transistor is turned ON when a pulse of the clock signal outputted from the first transistor included in the adjacent unit circuit downstream in the data transfer direction is applied to the control electrode of the sixth transistor; and the fifth transistor is turned ON when the sixth transistor is turned ON.

In a preferred embodiment, the control signal producing means further includes turn-OFF means for changing the potential at the control electrode of the fifth transistor so as to turn OFF the fifth transistor when the data is outputted from an adjacent unit circuit upstream in the data transfer direction.

In a preferred embodiment, the turn-OFF means is a seventh transistor including a control electrode, an input-side diffusion layer and an output-side diffusion layer, wherein the input-side diffusion layer is connected to the output-side diffusion layer of the sixth transistor, the control electrode is connected to the output-side diffusion layer of the first transistor included in the adjacent unit circuit upstream in the data transfer direction, and a predetermined voltage is applied to the output-side diffusion layer; the seventh transistor is turned ON only when a pulse of the clock signal outputted from the first transistor of the adjacent unit circuit upstream in the data transfer direction is applied to the control electrode of the seventh transistor; and the fifth transistor is turned OFF when the seventh transistor is turned ON.

In a preferred embodiment, the potential controlling means of the unit circuit of a first block among the plurality of blocks of unit circuits further includes turn-OFF means for changing the potential at the control electrode of the fifth transistor so as to turn OFF the fifth transistor when the data is inputted to the unit circuit of the first block.

In a preferred embodiment, the turn-OFF means is a seventh transistor including a control electrode, an input-side diffusion layer and an output-side diffusion layer, wherein the input-side diffusion layer is connected to the output-side diffusion layer of the sixth transistor, the control electrode is connected to the control electrode of the first transistor, and a predetermined voltage is applied to the output-side diffusion layer; the seventh transistor is turned ON only when the data is inputted to the unit circuit to which the seventh transistor belongs; and the fifth transistor is turned OFF when the seventh transistor is turned ON.

In a preferred embodiment, the potential controlling means of the unit circuit of a last block among the plurality of blocks of unit circuits further includes control signal producing means for producing the control signal by using the data inputted to a unit circuit upstream in the data transfer direction.

In a preferred embodiment, the control signal producing means further includes a sixth transistor including a control electrode, an input-side diffusion layer and an output-side diffusion layer, wherein the input-side diffusion layer and the control electrode are connected to the control electrode of the first transistor included in the unit circuit upstream in the data transfer direction, and the output-side diffusion layer is connected to the control electrode of the fifth transistor; the sixth transistor is turned ON when the data is inputted to the control electrode of the first transistor included in the unit circuit upstream in the data transfer direction; and the fifth transistor is turned ON when the sixth transistor is turned ON.

In a preferred embodiment, the control signal producing means is a sixth transistor including a control electrode, an input-side diffusion layer and an output-side diffusion layer, wherein the control electrode is connected to the control electrode of the first transistor included in the unit circuit upstream in the data transfer direction, the output-side diffusion layer is connected to the control electrode of the fifth transistor, and a predetermined DC voltage is applied to the input-side diffusion layer; the sixth transistor is turned ON when the data is inputted to the control electrode of the first transistor included in the unit circuit upstream in the data transfer direction; and the fifth transistor is turned ON when the sixth transistor is turned ON.

In a preferred embodiment, the potential controlling means further includes potential applying means for applying such a potential that the fifth transistor is turned ON to a portion between the output-side diffusion layer of the sixth transistor and the input-side diffusion layer of the seventh transistor when or immediately before the data is inputted to the unit circuit of the first block.

In a preferred embodiment, the potential applying means is an eighth transistor including a control electrode, an input-side diffusion layer and an output-side diffusion layer, wherein such a potential that the fifth transistor is turned ON is applied to the input-side diffusion layer, the output-side diffusion layer is connected to a portion between the output-side diffusion layer of the sixth transistor and the input-side diffusion layer of the seventh transistor, and a predetermined pulse signal is applied to the control electrode; and the eighth transistor is turned ON in response to the predetermined pulse signal applied to the control electrode during a period after the data is outputted from the unit circuit of the last block until new data is inputted to the unit circuit of the first block so as to output such a potential that the fifth transistor is turned ON from the output-side diffusion layer of the eighth transistor.

In a preferred embodiment, the potential controlling means further includes potential applying means for applying such a potential that the fifth transistor is turned ON to a portion between the output-side diffusion layer of the sixth transistor and the input-side diffusion layer of the seventh transistor.

In a preferred embodiment, the potential controlling means further includes control signal producing means for producing the control signal by using a potential at the control electrode of the first transistor included in the unit circuit to which the control signal producing means belongs.

In a preferred embodiment, the control signal producing means is an inverter for outputting an inversion of the potential at the control electrode of the first transistor included in the unit circuit to which the inverter belongs; and the fifth transistor is turned ON when a signal of a relatively high voltage level is outputted from the inverter.

In a preferred embodiment, the clock signal includes a first clock signal and a second clock signal having pulses that appear with the same period but in an alternating manner; the first clock signal is applied to the input-side diffusion layer of the first transistor included in the unit circuit of an odd-numbered block; the unit circuit of an odd-numbered block further includes a ninth transistor including a control electrode, an input-side diffusion layer and an output-side diffusion layer, wherein the second clock signal is applied to the control electrode, the output-side diffusion layer is connected to the control electrode of the first transistor, and input-side diffusion layer is connected to the output-side diffusion layer of the second transistor included in an adjacent unit circuit upstream in the data transfer direction; the second clock signal is applied to the input-side diffusion layer of the first transistor included in the unit circuit of an even-numbered block; the unit circuit of an even-numbered block further includes a tenth transistor including a control electrode, an input-side diffusion layer and an output-side diffusion layer, wherein the first clock signal is applied to the control electrode, the output-side diffusion layer is connected to the control electrode of the first transistor, and the input-side diffusion layer is connected to the output-side diffusion layer of the second transistor included in an adjacent unit circuit upstream in the data transfer direction; and the ninth transistor and the tenth transistor are turned OFF when the first transistor included in the unit circuit to which the ninth and tenth transistors belong is turned ON.

The present invention is directed not only to a shift register, but also to a MOS-type solid-state image sensor and a camera using the shift register.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows an alternative configuration of the shift register of the second embodiment of the present invention;

FIG. 15A is an equivalent circuit diagram of a transistor 3 included in a unit circuit of a conventional shift register, where the transistor 3 is ON;

FIG. 15B is an equivalent circuit diagram of a transistor 3 included in a unit circuit in the shift register of the third embodiment of the present invention, where the transistor 3 is ON;

DESCRIPTION OF THE PREFERRED EMBODIMENTS

Figure 1:
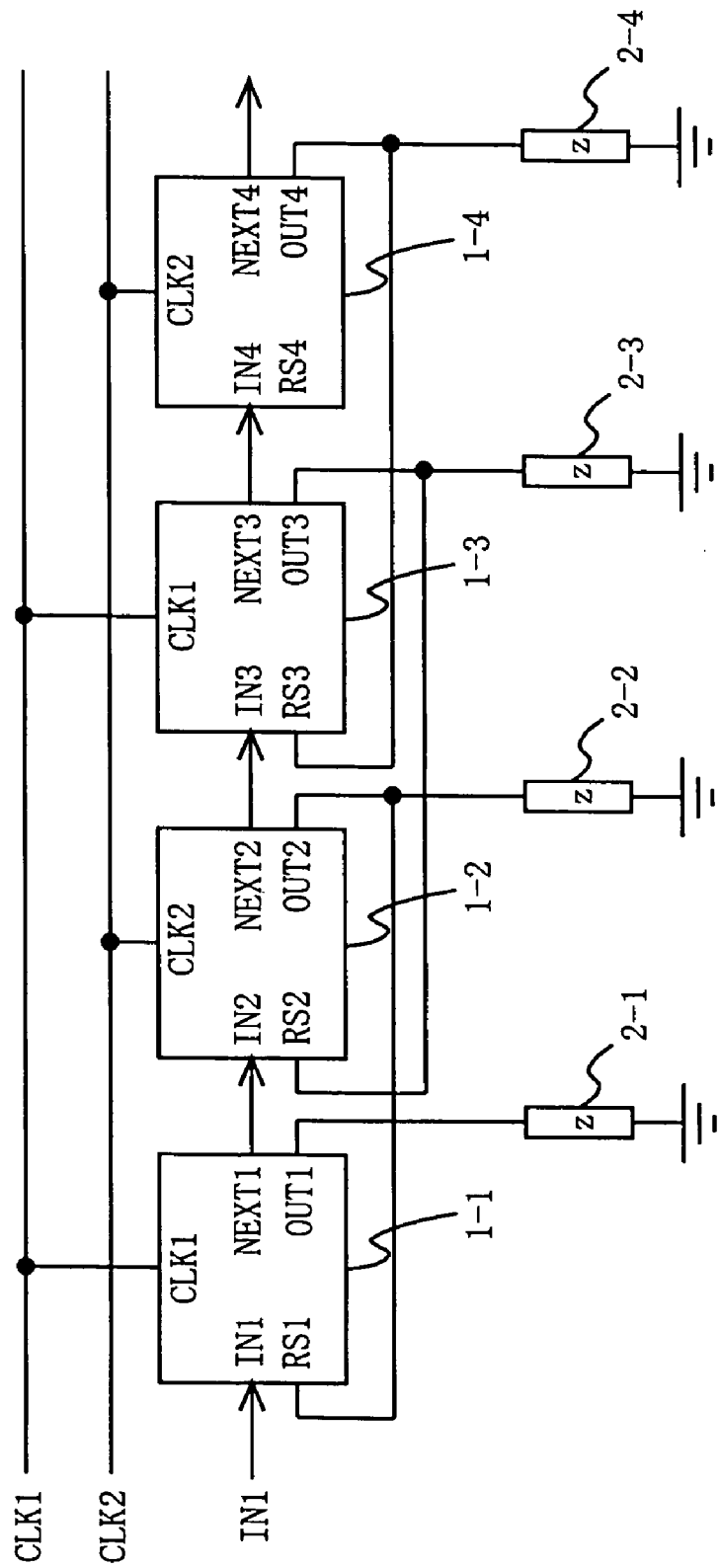
FIG. 1 shows a configuration of a shift register according to a first embodiment of the present invention.

A shift register according to the first embodiment of the present invention will now be described with reference to the drawings. FIG. 1 shows a configuration of the shift register of the present embodiment.

Figure 17:
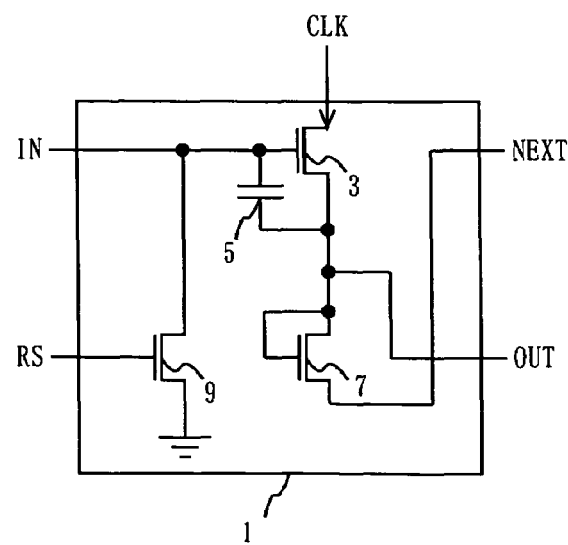
FIG. 17 shows a configuration of a unit circuit of the conventional shift register.

Referring to FIG. 1, the shift register includes four blocks of unit circuits 1-1 to 1-4 and resistive elements 2-1 to 2-4. The shift register transfers data in one direction (from left to right in FIG. 1) based on two clock signals CLK1 and CLK2 having a predetermined period. The clock signals CLK1 and CLK2 are signals having pulses that appear with the same period but in an alternating manner. A unit circuit 1 outputs an output signal NEXT (i.e., data being transferred) to another unit circuit 1 of an adjacent block downstream in the data transfer direction (hereinafter referred to as the "subsequent block"), and outputs an output signal OUT at the same time. The output signal OUT serves as a reset signal RS for erasing data stored in another unit circuit 1 of an adjacent block upstream in the data transfer direction (hereinafter referred to as the "preceding block"). The output signal NEXT serves as an input signal IN to the unit circuit 1 of the subsequent block. Referring to FIG. 17, the unit circuit 1 will now be described in greater detail.

First, the circuit configuration of the unit circuit 1 will be described. Referring to FIG. 17, the unit circuit 1 includes a transistor 3, a capacitor 5, a transistor 7 and a transistor 9. The drain of the transistor 3 is connected to the signal line of the clock signal CLK1, and the clock signal CLK1 is received via the drain of the transistor 3. The input signal IN is applied to the gate of the transistor 3. The source of the transistor 3 is connected to the drain of the transistor 7. The source of the transistor 3 is also connected to the unit circuit 1 of the preceding block, and the output signal OUT is outputted via the source of the transistor 3.

The gate of the transistor 7 is connected to the drain of the transistor 7. The source of the transistor 7 is connected to the unit circuit 1 of the subsequent block, and the output signal NEXT is outputted via the source of the transistor 7. The capacitor 5 is connected between the gate and the source of the transistor 3.

The input signal IN is applied to the drain of the transistor 9. The reset signal RS is applied to the gate of the transistor 9. The source of the transistor 9 is grounded.

The functions of the components of the unit circuit 1 shown in FIG. 17 will now be described. The transistor 3 selectively outputs or does not output the clock signal based on the voltage value of the input signal IN applied to the gate thereof. Specifically, the transistor 3 outputs the clock signal CLK via the source thereof if the input signal IN has a voltage at a high level indicating data of "1". If the input signal IN has a voltage at a low level, the transistor 3 does not output the clock signal CLK via the source thereof. In such a case, the potential at the source of the transistor 3 is equal to the low level of the clock signal CLK. Thus, only if the gate potential of the transistor 3 is at the high level, the transistor 3 is turned ON to output a pulse of the clock signal CLK via the source thereof.

The capacitor 5 is capacitor means for storing data outputted from a unit circuit of the preceding block. Specifically, the capacitor 5 stores data transferred from the unit circuit 1 of the preceding block. Where the capacitor 5 has data stored therein, the gate potential of the transistor 3 is at the high level, whereby the transistor 3 is turned ON. The capacitor 5 may be a capacitor formed between the gate and the drain of the transistor 3 or a capacitor formed between the gate and the source of the transistor 3, or may be a separately-provided capacitor.

The transistor 7 is a switch that determines whether or not the clock signal CLK from the source of the transistor 3 is to be outputted as the output signal NEXT. Specifically, a voltage at the high level indicating data of "1" is outputted from the source of the transistor 7 as the output signal NEXT if a voltage at the high level is applied to the drain and the source thereof. If a voltage at the low level is applied to the drain and the gate of the transistor 7, the transistor 7 is turned OFF, whereby a voltage at the low level at the drain thereof is not outputted to the source thereof. Thus, only if the gate and the drain of the transistor 7 receive a pulse (specifically, a signal having a voltage at the high level) of the clock signal CLK from the transistor 3, the transistor 7 is turned ON to output data via the source thereof to the unit circuit 1 of the subsequent block.

The transistor 9 erases data stored in the capacitor 5 using the output signal OUT from the unit circuit 1 of the subsequent block as the reset signal RS. Thus, the transistor 9 serves to clear the data stored in the unit circuit 1 to which it belongs after the unit circuit 1 to which it belongs outputs the charge being transferred.

Next, characteristic portions of the shift register of the present embodiment, i.e., the resistive elements 2-1 to 2-4, will be described. Referring to FIG. 1, one end of each resistive element 2 is connected between the source of the transistor 3 and the gate of the transistor 7, and the other end thereof is grounded. The resistive element 2 serves to prevent the portion between the source of the transistor 3 and the gate of the transistor 7 from being brought to a high-impedance state. Specifically, the resistive element 2 serves to control the gate potential of the transistor 7 to such a potential that the transistor 7 is kept OFF during the period in which the transistor 7 is supposed to be OFF. For this purpose, the resistive element 2 has a resistance value sufficiently larger than that of the transistor 3 when the transistor 3 is ON. Specifically, where the transistor 3 being ON has a resistance value of 1 kΩ, the resistive element 2 has a resistance value of 10 to 100 kΩ.

Figure 18:
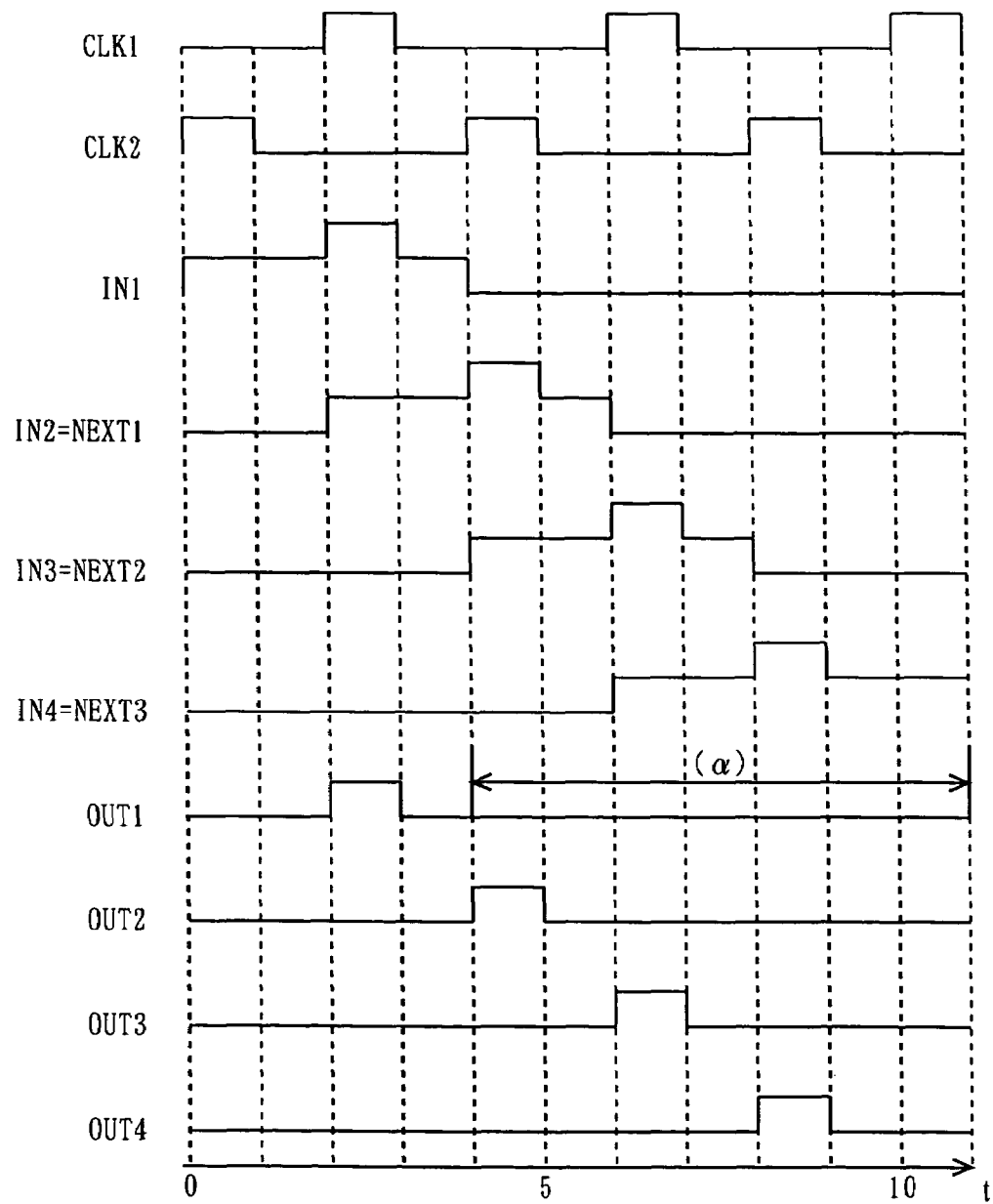
FIG. 18 shows transitions of the levels of various signals when the conventional shift register is transferring data.

Referring to FIG. 18, the operation of the shift register of the present embodiment having such a configuration will now be described. FIG. 18 shows voltage transitions of various signals when the conventional shift register is transferring data.

At t=0, the unit circuit 1-1 receives data to be transferred. Specifically, the unit circuit 1-1 receives the input signal IN1 having a voltage at the high level. The data is stored in the capacitor 5 of the unit circuit 1-1, and the gate potential of the transistor 3 of the unit circuit 1-1 increases to the high level. As a result, the transistor 3 of the unit circuit 1-1 is turned ON.

At t=2, the voltage of the clock signal CLK1 transitions to the high level. Since the transistor 3 of the unit circuit 1-1 is ON, the transistor 3 outputs a pulse of the clock signal CLK1 having a voltage at the high level via the source thereof. Thus, the voltage of the output signal OUT1 increases to the high level. At this point, the gate of the transistor 3 of the unit circuit 1-1 shown in FIG. 17 is in a high-impedance state. Therefore, if the potential at the lower electrode of the capacitor 5 of the unit circuit 1-1 varies, the potential at the upper electrode of the capacitor 5 of the unit circuit 1-1 (i.e., the gate potential of the transistor 3 of the unit circuit 1-1) also varies. Thus, if the source potential of the transistor 3 of the unit circuit 1-1 (i.e., the voltage of the output signal OUT1) transitions to the high level, the gate potential of the transistor 3 of the unit circuit 1-1 (i.e., the voltage of the input signal IN1) also increases.

Moreover, at t=2, a voltage at the high level is applied to the gate and the drain of the transistor 7 of the unit circuit 1-1. Thus, the transistor 7 of the unit circuit 1-1 is turned ON. As a result, the voltage of the output signal NEXT1 increases to the high level. Thus, data is transferred from the unit circuit 1-1 to the unit circuit 1-2.

At t=3, the voltage of the clock signal CLK1 decreases to the low level. Accordingly, the voltage of the output signal OUT1 also decreases to the low level. Similarly, the gate potential of the transistor 3 of the unit circuit 1-1 (i.e., the voltage of the input signal IN1) decreases.

Moreover, at t=3, as the voltage of the clock signal CLK1 decreases to the low level, the drain potential and the gate potential of the transistor 7 of the unit circuit 1-1 also decrease. As a result, the transistor 7 of the unit circuit 1-1 is turned OFF.

At t=4, the voltage of the clock signal CLK2 transitions to the high level. Since the transistor 3 of the unit circuit 1-2 is ON, the transistor 3 outputs a pulse of the clock signal CLK2 having a voltage at the high level via the source thereof. Thus, the voltage of the output signal OUT2 increases to the high level. At this point, the gate of the transistor 3 of the unit circuit 1-2 shown in FIG. 17 is in a high-impedance state. Therefore, if the potential at the lower electrode of the capacitor 5 of the unit circuit 1-2 varies, the potential at the upper electrode of the capacitor 5 of the unit circuit 1-2 (i.e., the gate potential of the transistor 3 of the unit circuit 1-2) also varies. Thus, if the source potential of the transistor 3 of the unit circuit 1-2 (i.e., the voltage of the output signal OUT2) transitions to the high level, the gate potential of the transistor 3 of the unit circuit 1-2 (i.e., the voltage of the input signal IN2) also increases.

The output signal OUT2 is used as the reset signal RS1 for the unit circuit 1-1. Therefore, as the voltage of the output signal OUT2 increases, the voltage of the reset signal RS1 also increases, thus clearing data stored in the capacitor 5 of the unit circuit 1-1. As a result, the gate potential of the transistor 3 of the unit circuit 1-1 (i.e., the voltage of the input signal IN1) decreases to the low level.

Moreover, at t=4, the clock signal CLK2 at the high level is applied to the gate and the drain of the transistor 7 of the unit circuit 1-2. Thus, the transistor 7 of the unit circuit 1-2 is turned ON. As a result, the voltage of the output signal NEXT2 increases to the high level. Thus, data is transferred from the unit circuit 1-2 to the unit circuit 1-3.

At t=4, the portion of the conventional shift register between the source of the transistor 3 and the gate of the transistor 7 is in a high-impedance state. In contrast, in the shift register of the present embodiment, the resistive element 2-1, one end of which is grounded, is connected to the portion between the source of the transistor 3 and the gate of the transistor 7. Therefore, the portion between the source of the transistor 3 and the gate of the transistor 7 is kept in a low-impedance state. As a result, the potential at the portion between the source of the transistor 3 and the gate of the transistor 7 stably stay at the low level.

At t=5, the voltage of the clock signal CLK2 decreases to the low level. Accordingly, the voltage of the output signal OUT2 also decreases to the low level. Similarly, the gate potential of the transistor 3 of the unit circuit 1-2 (i.e., the voltage of the input signal IN2) decreases.

Moreover, at t=5, as the voltage of the clock signal CLK2 decreases to the low level, the gate potential and the drain potential of the transistor 7 of the unit circuit 1-2 also decrease. As a result, the transistor 7 of the unit circuit 1-2 is turned OFF.

At t=6, the voltage of the clock signal CLK1 transitions to the high level. Since the transistor 3 of the unit circuit 1-3 is ON, the transistor 3 outputs the clock signal CLK1 having a voltage at the high level via the source thereof. Thus, the voltage of the output signal OUT3 increases to the high level. At this point, the gate of the transistor 3 of the unit circuit 1-3 shown in FIG. 17 is in a high-impedance state. Therefore, if the potential at the lower electrode of the capacitor 5 of the unit circuit 1-3 varies, the potential at the upper electrode of the capacitor 5 of the unit circuit 1-3 (i.e., the gate potential of the transistor 3 of the unit circuit 1-3) also varies. Thus, if the source potential of the transistor 3 of the unit circuit 1-3 (i.e., the voltage of the output signal OUT3) transitions to the high level, the gate potential of the transistor 3 of the unit circuit 1-3 (i.e., the voltage of the input signal IN3) also increases.

The output signal OUT3 is used as the reset signal RS2 for the unit circuit 1-2. Therefore, as the voltage of the output signal OUT3 increases, the voltage of the reset signal RS2 also increases, thus clearing data stored in the capacitor 5 of the unit circuit 1-2. As a result, the gate potential of the transistor 3 of the unit circuit 1-2 (i.e., the voltage of the input signal IN2) decreases to the low level.

Moreover, at t=6, the clock signal CLK1 at the high level is applied to the gate and the drain of the transistor 7 of the unit circuit 1-3. Thus, the transistor 7 of the unit circuit 1-3 is turned ON. As a result, the voltage of the output signal NEXT3 increases to the high level. Thus, data is transferred from the unit circuit 1-3 to the unit circuit 1-4.

At t=7, the voltage of the clock signal CLK1 decreases to the low level. Accordingly, the voltage of the output signal OUT3 also decreases to the low level. Similarly, the gate potential of the transistor 3 of the unit circuit 1-3 (i.e., the voltage of the input signal IN3) decreases.

Moreover, at t=7, as the voltage of the clock signal CLK1 decreases to the low level, the gate potential and the drain potential of the transistor 7 of the unit circuit 1-3 also decrease. As a result, the transistor 7 of the unit circuit 1-3 is turned OFF.

At t=8, the voltage of the clock signal CLK2 transitions to the high level. Since the transistor 3 of the unit circuit 1-4 is ON, the transistor 3 outputs the clock signal CLK2 having a voltage at the high level via the source thereof. Thus, the voltage of the output signal OUT4 increases to the high level. At this point, the gate of the transistor 3 of the unit circuit 1-4 shown in FIG. 17 is in a high-impedance state. Therefore, if the potential at the lower electrode of the capacitor 5 of the unit circuit 1-4 varies, the potential at the upper electrode of the capacitor 5 of the unit circuit 1-4 (i.e., the gate potential of the transistor 3 of the unit circuit 1-4) also varies. Thus, if the source potential of the transistor 3 of the unit circuit 1-4 (i.e., the voltage of the output signal OUT4) transitions to the high level, the gate potential of the transistor 3 of the unit circuit 1-4 (i.e., the voltage of the input signal IN4) also increases.

Moreover, at t=8, the clock signal CLK2 at the high level is applied to the gate and the drain of the transistor 7 of the unit circuit 1-4. Thus, the transistor 7 of the unit circuit 1-4 is turned ON. As a result, the voltage of the output signal NEXT3 increases to the high level. Thus, data is outputted from the unit circuit 1-4. The shift register of the present embodiment shown in FIG. 1 transfers data from left to right through an operation as described above.

As described above, the shift register of the present embodiment includes a resistive element for each unit circuit 1 having one end grounded and the other end connected between the transistor 3 and the transistor 7 of the unit circuit 1. This prevents the portion between the transistor 3 and the transistor 7 from being brought to a high-impedance state. As a result, the potential at the portion between the transistor 3 and the transistor 7 becomes stable, thereby preventing the shift register from malfunctioning.

While the shift register of the present embodiment includes four blocks of unit circuits 1, the number of unit circuits 1 is not limited to any particular number as long as two or more unit circuits 1 are provided.

Figure 2:
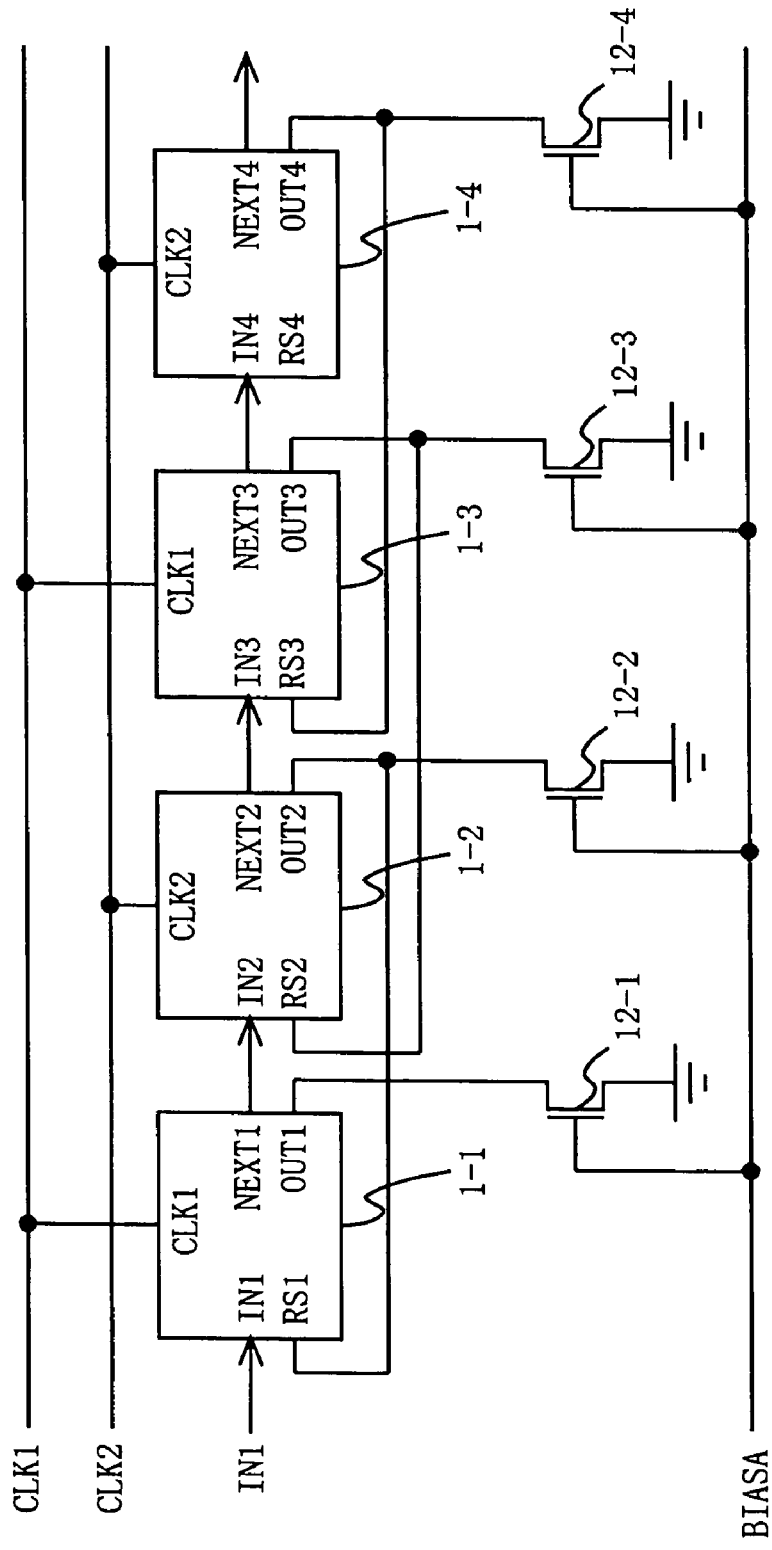
FIG. 2 shows an alternative configuration of the shift register of the first embodiment of the present invention.

While the shift register of the present embodiment includes the resistive element 2 connected between the transistor 3 and the transistor 7, the element connected between the transistor 3 and the transistor 7 is not limited to the resistive element 2. For example, a transistor 12 may be connected between the transistor 3 and the transistor 7, as shown in FIG. 2. Specifically, the transistor 12 has a drain connected to the portion between the source of the transistor 3 and the gate of the transistor 7, a source grounded, and a gate to which a DC voltage BIASA is applied. The DC voltage BIASA applied to the gate of the transistor 12 is such a voltage that a resistance similar to that of the resistive element 2 is created between the drain and the source of the transistor 12. With the use of the transistor 12, it is possible to more precisely control the potential at the portion between the transistor 3 and the transistor 7.

Figure 3:
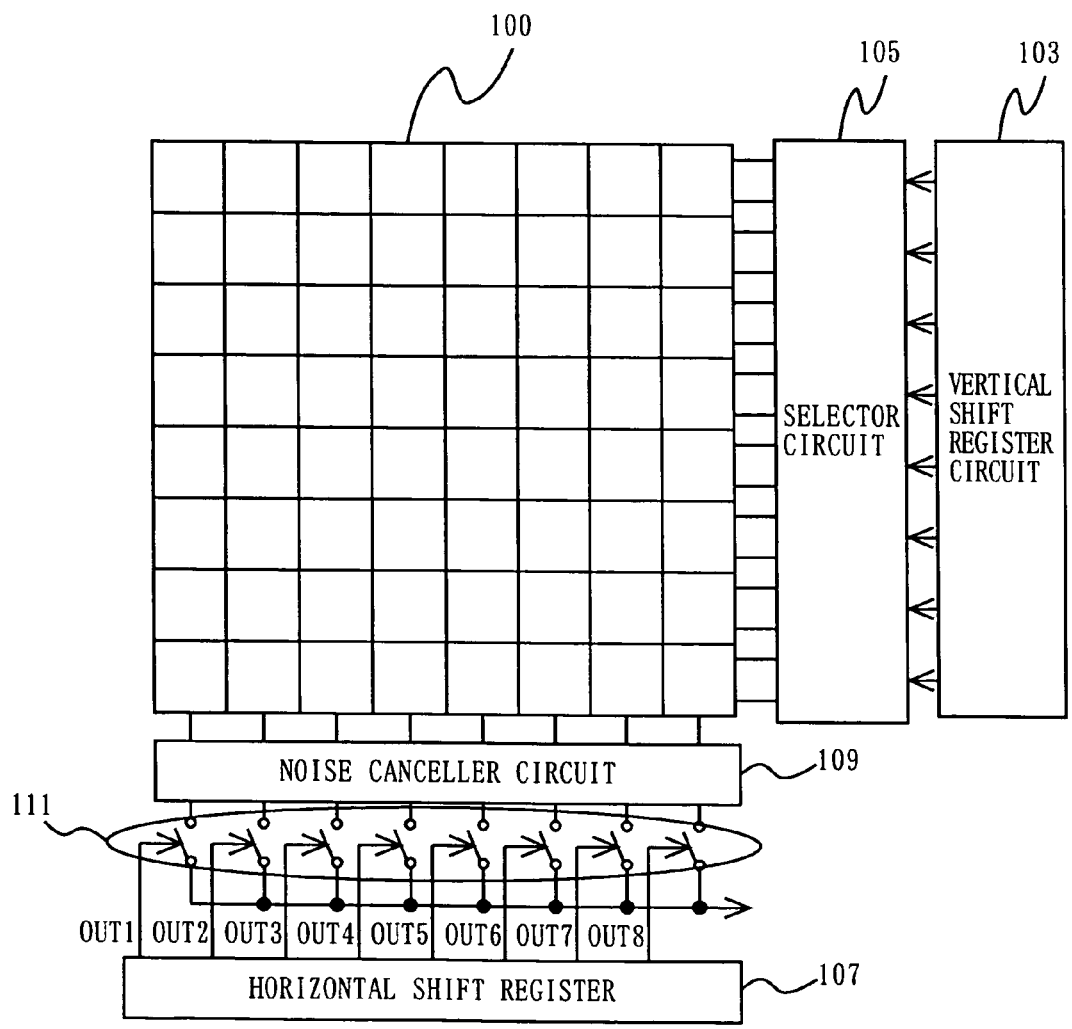
FIG. 3 shows a configuration of a MOS-type solid-state image sensor using shift registers of the first embodiment of the present invention.

An exemplary application of the shift register of the present embodiment will now be described with reference to the drawings. The shift register of the present embodiment is preferably used in MOS-type solid-state image sensors. A MOS-type solid-state image sensor using the shift register of the present embodiment will now be described with reference to the drawings. FIG. 3 shows a configuration of a MOS-type solid-state image sensor using the shift register of the present embodiment.

The MOS-type solid-state image sensor includes a light-receiving region 100, a vertical shift register 103, a selector circuit 105, a horizontal shift register 107, a noise canceller circuit 109 and switches 111. The light-receiving region 100 includes a matrix of light-receiving elements for converting incident light into signal charges. A plurality of row selection lines are provided between rows of light-receiving elements for selecting the light-receiving elements row by row. A plurality of signal lines are provided between columns of light-receiving elements for reading out signals.

The vertical shift register 103 is a shift register for transferring data in the vertical direction. The vertical shift register 103 includes a plurality of unit circuits. A unit circuit having the data being transferred outputs the data to another unit circuit of the subsequent block, and at the same time outputs a selection signal to the selector circuit 105 for selecting a row. The selector circuit 105 selects a row of light-receiving elements designated by the selection signal outputted from the vertical shift register 103.

The horizontal shift register 107 includes the shift register shown in FIG. 1, and transfers data in one direction, i.e., from left to right in FIG. 3. A unit circuit 1 of the horizontal shift register 107 outputs data to another unit circuit 1 of the subsequent block, and at the same time outputs the output signal OUT having a voltage at the high level to the switch 111. Each unit circuit 1 has a configuration as described above with reference to FIG. 17, and the configuration of the unit circuit 1 will not be further described below.

The switch 111 is provided for each unit circuit 1 of the horizontal shift register 107, and may be a transistor, for example. Specifically, where the switch 111 is a transistor, the switch 111 has a drain connected to a signal line of the light-receiving region 100 via the noise canceller circuit 109, a source connected to the output side, and a gate to which the output signal OUT is applied. Each switch 111 is turned ON when the output signal OUT having a voltage at the high level is outputted thereto from the horizontal shift register 107. Thus, the switches 111 are successively turned ON from left to right as the data is transferred from left to right through the horizontal shift register 107. The noise canceller circuit 109 is a circuit for removing noise from the signal charge read out from the light-receiving region 100.

A particular configuration of a MOS-type solid-state image sensor using the shift register shown in FIG. 1 will now be described. Where the shift register shown in FIG. 1 is used in the MOS-type solid-state image sensor, the resistive element 2 needs to have such a resistance value that the potential at the portion between the source of the transistor 3 and the gate of the transistor 7 (i.e., the voltage of the output signal OUT) can be controlled to such a potential that the switch 111 is kept OFF during the period in which the transistor 7 is supposed to be OFF. This is for preventing the problem that the portion between the source of the transistor 3 and the gate of the transistor 7 is brought to a high-impedance state during the period (α) in FIG. 18, whereby the voltage of the output signal OUT becomes unstable, thus erroneously turning ON the switch 111.

The operation of the MOS-type solid-state image sensor having such a configuration will now be described with reference to the drawings.

First, the unit circuit of the first block in the vertical shift register 103 receives data of "1". Then, the unit circuit of the first block outputs the data of "1" to the unit circuit of the second block. At this time, the unit circuit of the first block outputs a selection signal to the selector circuit 105 for selecting the first row of light-receiving elements. In response to this, the selector circuit 105 activates the first row selection line based on the selection signal, whereby a signal charge is read out from each light-receiving element of the first row to the signal line of the corresponding column.

Then, the horizontal shift register 107 transfers the data of "1" from the unit circuit 1 of the first block to the unit circuit 1 of the last block. As the data is transferred, the unit circuits 1 successively output the output signal OUT having a voltage at the high level to the corresponding switches 111. Thus, the switches 111 are successively turned ON from left to right. The signal charges, which have been read out to the signal lines, are successively outputted to the outside of the solid-state image sensor each via the corresponding switch 111 being ON. The signal charges of the first row are outputted to the outside through the operation as described above.

Then, the unit circuit of the second block in the vertical shift register 103 outputs data to the unit circuit of the third block. At this time, the second row of light-receiving elements are selected. Then, signal charges produced by the second row of light-receiving elements are read out as described above for the first row, which will not be repeatedly described below. The same operation is done for the third and subsequent rows.

In the solid-state image sensor shown in FIG. 3, the portion between the transistor 3 and the transistor 7 is prevented from being brought to a high-impedance state, as described above. As a result, the switch 111 is prevented from being turned ON erroneously.

The shift register shown in FIG. 1 is used in the horizontal shift register 107 of the solid-state image sensor shown in FIG. 3. Alternatively, the shift register shown in FIG. 2 may be used in the horizontal shift register 107.

While the shift register of the present embodiment is used in the horizontal shift register 107 of the solid-state image sensor shown in FIG. 3, it may alternatively be used in the vertical shift register 103.

The solid-state image sensor shown in FIG. 3 is preferably used in a digital still camera. In such a case, the digital still camera includes an external circuit for performing a predetermined operation, such as an image processing operation, on the data outputted from the solid-state image sensor.

In the first embodiment described above, the resistive element 2 or the transistor 12 is used for preventing the portion between the transistor 3 and the transistor 7 from being brought to a high-impedance state. However, the element connected between the transistor 3 and the transistor 7 is not limited thereto. The second embodiment below is directed to a shift register in which an element different from those used in the first embodiment is connected between the transistor 3 and the transistor 7.

Figure 4:
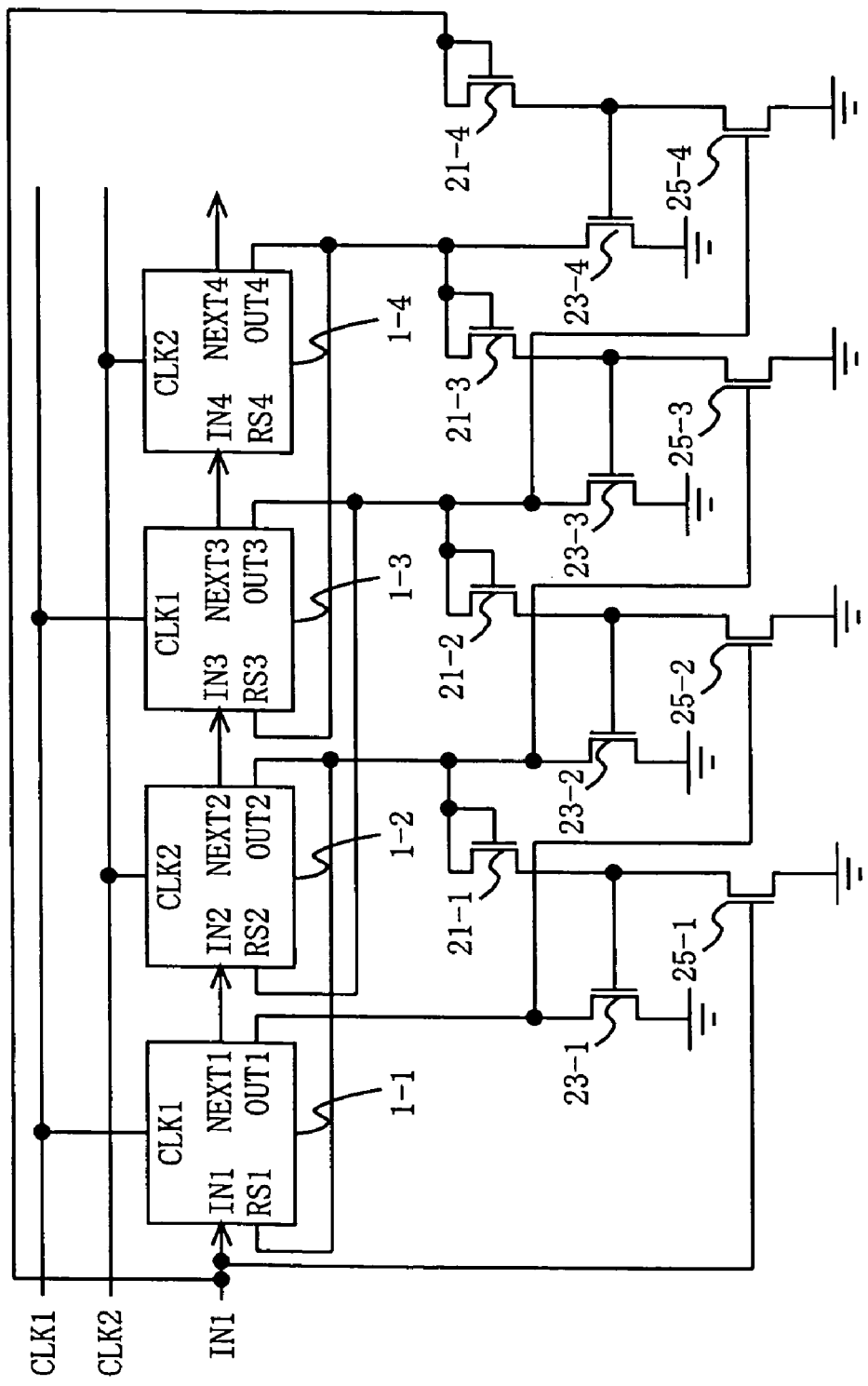
FIG. 4 shows a configuration of a shift register according to a second embodiment of the present invention.

A shift register according to the second embodiment of the present invention will now be described with reference to the drawings. FIG. 4 shows a configuration of the shift register of the present embodiment. In the shift register of the first embodiment, the portion between the transistor 3 and the transistor 7 is always grounded via the resistive element 2. In contrast, in the shift register of the present embodiment, the portion between the transistor 3 and the transistor 7 is grounded via a transistor. The transistor is turned ON when the portion between the transistor 3 and the transistor 7 may possibly be brought to a high-impedance state, and is turned OFF otherwise.

Referring to FIG. 4, the shift register includes unit circuits 1, transistors 21, transistors 23 and transistors 25. Referring to FIG. 17, each unit circuit 1 includes the transistor 3, the capacitor 5, the transistor 7 and the transistor 9. Each unit circuit 1 is similar to that used in the first embodiment, and will not be further described below.

Now, a characteristic portion of the present invention, i.e., the circuit configuration of the transistor 21, the transistor 23 and the transistor 25, will be described with reference to FIG. 4. The transistor 21-1, the transistor 23-1 and the transistor 25-1 together form a first group. Similarly, the transistors 21-2, 23-2 and 25-2 together form a second group, the transistors 21-3, 23-3 and 25-3 a third group, and the transistors 21-4, 23-4 and 25-4 a fourth group.

First, the circuit configuration of the first group will be described. The first group is part of the unit circuit 1-1 of the first block. The output signal OUT2 from the unit circuit 1-2 of the subsequent block is applied to the gate and the drain of the transistor 21-1. Thus, the gate and the drain of the transistor 21-1 are connected to the portion of the unit circuit 1-2 of the subsequent block between the source of the transistor 3 and the gate of the transistor 7. The source of the transistor 21-1 is connected to the drain of the transistor 25-1. The source of the transistor 25-1 is grounded. The gate of the transistor 25-1 is connected to the gate of the transistor 3 of the unit circuit 1-1.

The output signal OUT1 from the unit circuit 1-1 is applied to the drain of the transistor 23-1. Thus, the drain of the transistor 23-1 is connected to the portion of the unit circuit 1-1 between the source of the transistor 3 and the gate of the transistor 7. The gate of the transistor 23-1 is connected to the source of the transistor 21-1. The source of the transistor 23-1 is grounded.

Next, the circuit configuration of the second group and that of the third group will be described. The second group is part of the unit circuit 1-2 of an intermediate block, and the third group is part of the unit circuit 1-3 of another intermediate block. The second group and the third group have the same circuit configuration. Therefore, only the circuit configuration of the second group will be described below. Moreover, the circuit configuration of the first group and that of the second group are similar to each other except for the position to which the gate of the transistor 25 is connected. Therefore, the description of the circuit configuration will be omitted except for the position to which the gate of the transistor 25 is connected.

The output signal OUT1 from the unit circuit 1-1 of the preceding block is applied to the gate of the transistor 25-2. Thus, the gate of the transistor 25-2 is connected to the portion of the unit circuit 1-1 of the preceding block between the source of the transistor 3 and the gate of the transistor 7.

Next, the circuit configuration of the fourth group will be described. The fourth group is part of the unit circuit 1-4 of the last block. The circuit configuration of the fourth group is similar to that of the second group except for the position to which the gate and the drain of the transistor 21 are connected. Therefore, the description of the circuit configuration will be omitted except for the position to which the gate and the drain of the transistor 21 are connected.

The gate and the drain of the transistor 21-4 are connected to the gate of the transistor 3 in the unit circuit 1-1 of the first block. The position to which the gate and the drain of the transistor 21-4 are connected is not limited to the gate of the transistor 3 in the unit circuit 1-1 of the first block, as long as they are connected to the gate of the transistor 3 in a unit circuit 1 that precedes the unit circuit 1-4 to which they belong.

The functions of the components of the shift register shown in FIG. 4 will now be described. The functions of the unit circuits 1-1 to 1-4 are similar to those of the first embodiment, and thus will not be further described below. The functions of the transistors included in the first to fourth groups will now be described.

The transistor 23 is a switch for turning ON/OFF the connection between the ground and the portion of the corresponding unit circuit 1 between the source of the transistor 3 and the gate of the transistor 7. Specifically, the transistor 23 is switched from the OFF state to the ON state when the transistor 3 and the transistor 7 of the corresponding unit circuit 1 are both OFF after the corresponding unit circuit 1 outputs data to the unit circuit 1 of the subsequent block. Thus, the transistor 23 prevents the portion of the corresponding unit circuit 1 between the source of the transistor 3 and the gate of the transistor 7 from being brought to a high-impedance state.

The transistor 21 serves to produce a control signal for turning ON/OFF the corresponding transistor 23. Specifically, the transistors 21-1 to 21-3 corresponding to the unit circuits 1-1 to 1-3 of the blocks other than the last block use the output signals OUT2 to OUT4 of the subsequent unit circuits 1-2 to 1-4 to produce control signals for controlling the transistors 23-1 to 23-3, respectively. In other words, the transistors 21-1 to 21-3 each output a signal of a voltage at the high level via the source thereof to the gate of the corresponding one of the transistors 23-1 to 23-3 when the voltage of the corresponding one of the output signals OUT2 to OUT4 from the subsequent unit circuits 1-2 to 1-4 transitions to the high level. Thus, the transistors 23-1 to 23-3 are turned ON when the transistor 3 and the transistor 7 of the corresponding unit circuits 1-1 to 1-3 are both OFF after the corresponding unit circuits 1-1 to 1-3 output data to the unit circuits 1-2 to 1-4 of the subsequent blocks.

The transistor 21-4 corresponding to the unit circuit 1-4 of the last block uses data to be inputted to the unit circuit 1-1 of the first block to produce a control signal for controlling the corresponding transistor 23-4. In other words, the transistor 21-4 outputs a signal of a voltage at the high level via the source thereof to the gate of the corresponding transistor 23-4 when data is inputted to the unit circuit 1-1. Thus, the transistor 23-4 is turned ON when the transistor 3 and the transistor 7 of the corresponding unit circuit 1-4 are both OFF after the corresponding unit circuit 1-4 outputs data to the outside.

The transistor 25 is a switch that serves to turn OFF the transistor 23 when the transistor 25 is switched from the OFF state to the ON state. This is because the transistor 23 needs to be turned back OFF when new data is inputted to the shift register.

The transistor 25-1 corresponding to the unit circuit 1-1 of the first block is turned ON when data is inputted to the unit circuit 1-1. Thus, the transistor 25-1 lowers the potential at the portion between the source of the transistor 21-1 and the drain of the transistor 25-1 to the low level. As a result, the transistor 23-1 is switched from the ON state to the OFF state.

The transistors 25-2 to 25-4 corresponding to the unit circuits 1-2 to 1-4 of the second to last blocks are turned ON when the preceding unit circuits 1-1 to 1-3 output the output signals OUT1 to OUT3 having a voltage at the high level. Thus, the transistors 25-2 to 25-4 lower the potentials at the portions between the sources of the transistors 21-2 to 21-4 and the drains of the transistors 25-2 to 25-4 to the low level. As a result, the transistors 23-2 to 23-4 are switched from the ON state to the OFF state.

Figure 5:
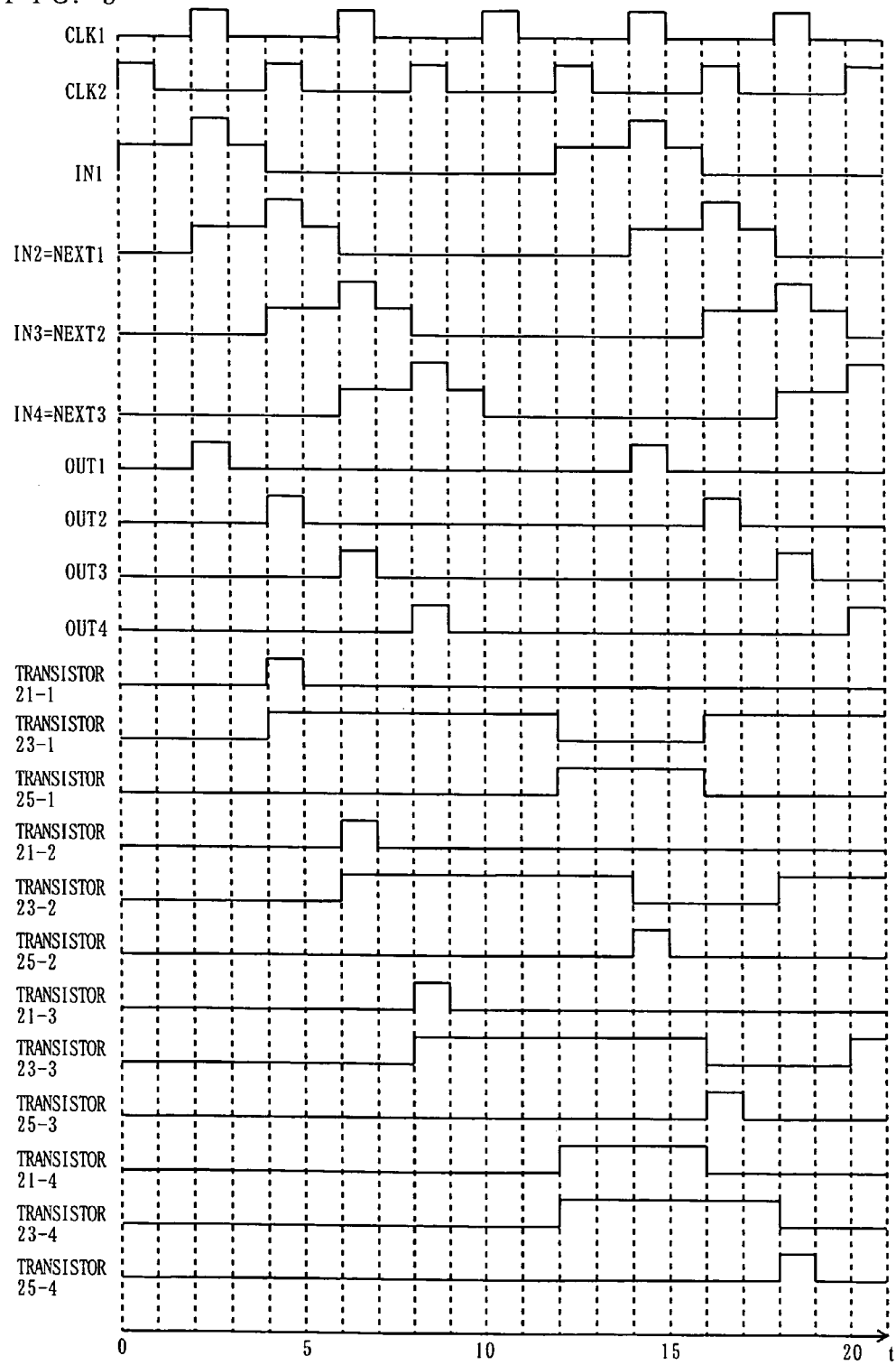
FIG. 5 shows transitions of the levels of various signals and the states of various transistors when the shift register of the second embodiment is transferring data.

The operation of the shift register of the present embodiment having such a configuration will now be described with reference to the drawings. FIG. 5 shows transitions of the levels of various signals and the states of various transistors when the shift register is transferring data.

The operation of the shift register during the period t=0-3 is similar to that of the first embodiment, and will not be further described below. In the initial state, the transistor 21, the transistor 23 and the transistor 25 are turned OFF.

At t=4, the voltage of the clock signal CLK2 transitions to the high level. Since the transistor 3 of the unit circuit 1-2 is ON, the transistor 3 outputs the clock signal CLK2 having a voltage at the high level via the source thereof. Thus, the voltage of the output signal OUT2 increases to the high level. At this point, the gate of the transistor 3 of the unit circuit 1-2 shown in FIG. 17 is in a high-impedance state. Therefore, if the potential at the lower electrode of the capacitor 5 of the unit circuit 1-2 varies, the potential at the upper electrode of the capacitor 5 of the unit circuit 1-2 (i.e., the gate potential of the transistor 3 of the unit circuit 1-2) also varies. Thus, if the source potential of the transistor 3 of the unit circuit 1-2 (i.e., the voltage of the output signal OUT2) transitions to the high level, the gate potential of the transistor 3 of the unit circuit 1-2 (i.e., the voltage of the input signal IN2) also increases.

The output signal OUT2 is used as the reset signal RS1 for the unit circuit 1-1. Therefore, as the voltage of the output signal OUT2 increases, the voltage of the reset signal RS1 also increases, thus clearing data stored in the capacitor 5 of the unit circuit 1-1. As a result, the gate potential of the transistor 3 of the unit circuit 1-1 (i.e., the voltage of the input signal IN1) decreases to the low level.

Moreover, at t=4, the clock signal CLK2 at the high level is applied to the gate and the drain of the transistor 7 of the unit circuit 1-2. Thus, the transistor 7 of the unit circuit 1-2 is turned ON. As a result, the voltage of the output signal NEXT2 increases to the high level. Thus, data is transferred from the unit circuit 1-2 to the unit circuit 1-3.

Furthermore, at t=4, since the voltage of the output signal OUT2 is increased, the transistor 21-1 is turned ON. Thus, a voltage at the high level is applied to the gate of the transistor 23-1, thus turning ON the transistor 23-1. As a result, the potential at the portion of the unit circuit 1-1 between the source of the transistor 3 and the gate of the transistor 7 will stably stay around the ground potential. Thus, the malfunction problem that occurs in the prior art due to a high-impedance state is resolved. Since the transistor 25-1 is OFF at t=4, the portion between the source of the transistor 21-1 and the drain of the transistor 25-1 will have a potential at the high level until t=12, when the transistor 25-1 is turned ON. Thus, the transistor 23-1 is kept ON during the period t=4-12.

The operation of the shift register of the present embodiment at t=5 is similar to that of the first embodiment. Specifically, the voltage of the clock signal CLK2 decreases to the low level. Accordingly, the voltage of the output signal OUT2 also decreases to the low level. Similarly, the gate potential of the transistor 3 of the unit circuit 1-2 (i.e., the voltage of the input signal IN2) decreases. Moreover, at t=5, as the voltage of the clock signal CLK2 decreases to the low level, the gate potential and the drain potential of the transistor 7 in the unit circuit 1-2 also decrease. As a result, the transistor 7 of the unit circuit 1-2 is turned OFF.

At t=6, the voltage of the clock signal CLK1 transitions to the high level. Since the transistor 3 of the unit circuit 1-3 is ON, the transistor 3 outputs the clock signal CLK1 having a voltage at the high level via the source thereof. Thus, the voltage of the output signal OUT3 increases to the high level. Moreover, the gate potential of the transistor 3 of the unit circuit 1-3 (i.e., the voltage of the input signal IN3) also increases.

The output signal OUT3 is used as the reset signal RS2 for the unit circuit 1-2. Therefore, as the voltage of the output signal OUT3 increases, the voltage of the reset signal RS2 also increases, thus clearing data stored in the capacitor 5 of the unit circuit 1-2. As a result, the gate potential of the transistor 3 of the unit circuit 1-2 (i.e., the voltage of the input signal IN2) decreases to the low level.

Moreover, at t=6, the clock signal CLK1 at the high level is applied to the gate and the drain of the transistor 7 of the unit circuit 1-3. Thus, the transistor 7 of the unit circuit 1-3 is turned ON. As a result, the voltage of the output signal NEXT3 increases to the high level. Thus, data is transferred from the unit circuit 1-3 to the unit circuit 1-4.

Furthermore, at t=6, since the voltage of the output signal OUT3 is increased, the transistor 21-2 is turned ON. Thus, a voltage at the high level is applied to the gate of the transistor 23-2, thus turning ON the transistor 23-2. As a result, the potential at the portion of the unit circuit 1-2 between the source of the transistor 3 and the gate of the transistor 7 will stably stay around the ground potential. Thus, the malfunction problem that occurs in the prior art due to a high-impedance state is resolved. Since the transistor 25-2 is OFF at t=6, the portion between the source of the transistor 21-2 and the drain of the transistor 25-2 will have a potential at the high level until t=14, when the transistor 25-2 is turned ON. Thus, the transistor 23-2 is kept ON during the period t=6-14.

The operation of the shift register of the present embodiment at t=7 is similar to that of the first embodiment. Specifically, the voltage of the clock signal CLK1 decreases to the low level. Accordingly, the voltage of the output signal OUT3 also decreases to the low level. Similarly, the gate potential of the transistor 3 of the unit circuit 1-3 (i.e., the voltage of the input signal IN3) decreases. Moreover, at t=7, as the voltage of the clock signal CLK1 decreases to the low level, the gate potential and the drain potential of the transistor 7 in the unit circuit 1-3 also decrease. As a result, the transistor 7 of the unit circuit 1-3 is turned OFF.

At t=8, the voltage of the clock signal CLK2 transitions to the high level. Since the transistor 3 of the unit circuit 1-4 is ON, the transistor 3 outputs the clock signal CLK1 having a voltage at the high level via the source thereof. Thus, the voltage of the output signal OUT4 increases to the high level. Moreover, the gate potential of the transistor 3 of the unit circuit 1-4 (i.e., the voltage of the input signal IN4) also increases.

The output signal OUT4 is used as the reset signal RS3 for the unit circuit 1-3. Therefore, as the voltage of the output signal OUT4 increases, the voltage of the reset signal RS3 also increases, thus clearing data stored in the capacitor 5 of the unit circuit 1-3. As a result, the gate potential of the transistor 3 of the unit circuit 1-3 (i.e., the voltage of the input signal IN3) decreases to the low level.

Moreover, at t=8, the clock signal CLK1 at the high level is applied to the gate and the drain of the transistor 7 of the unit circuit 1-4. Thus, the transistor 7 of the unit circuit 1-4 is turned ON. As a result, the voltage of the output signal NEXT4 increases to the high level. Thus, data is transferred to the outside of the unit circuit 1-4.

Furthermore, at t=8, since the voltage of the output signal OUT4 is increased, the transistor 21-3 is turned ON. Thus, a voltage at the high level is applied to the gate of the transistor 23-3, thus turning ON the transistor 23-3. As a result, the potential at the portion of the unit circuit 1-3 between the source of the transistor 3 and the gate of the transistor 7 will stably stay around the ground potential. Thus, the malfunction problem that occurs in the prior art due to a high-impedance state is resolved. Since the transistor 25-3 is OFF at t=8, the portion between the source of the transistor 21-3 and the drain of the transistor 25-3 will have a potential at the high level until t=16, when the transistor 25-3 is turned ON. Thus, the transistor 23-3 is kept ON during the period t=8-16.

At t=12, new data is inputted to the unit circuit 1-1. The operation performed by the transistor 3 and the transistor 7 of the unit circuits 1-1 to 1-4 at and after t=12 is the same as that performed by the unit circuits 1-1 to 1-4 during the period t=1-10. Therefore, the following description will focus on the operations of the transistor 21, the transistor 23 and the transistor 25.

At t=12, the gate potential of the unit circuit 1-1 increases to the high level. As a result, a voltage at the high level is applied to the gate of the transistor 25-1, thereby turning ON the transistor 25-1. As the transistor 25-1 is turned ON, the potential at the portion between the transistor 21-1 and the transistor 25-1 decreases to the low level, thereby turning OFF the transistor 23-1. Thus, the first group is initialized.

Moreover, at t=12, as the gate potential of the unit circuit 1-1 increases to the high level, the transistor 21-4 is turned ON. Thus, a signal at the high level is outputted from the source of the transistor 21-4, thereby turning ON the transistor 23-4. As a result, the potential at the portion between the transistor 3 and the transistor 7 of the unit circuit 1-4 will stably stay around the ground potential. Thus, the malfunction problem that occurs in the prior art due to a high-impedance state is resolved. Since the transistor 25-4 is OFF at t=12, the portion between the source of the transistor 21-4 and the drain of the transistor 25-4 will have a potential at the high level until t=18, when the transistor 25-4 is turned ON. Thus, the transistor 23-4 is kept ON during the period t=12-18.

At t=14, the voltage of the output signal OUT1 increases to the high level. As a result, a voltage at the high level is applied to the gate of the transistor 25-2, thereby turning ON the transistor 25-2. As the transistor 25-2 is turned ON, the potential at the portion between the transistor 21-2 and the transistor 25-2 decreases to the low level, thereby turning OFF the transistor 23-2. Thus, the second group is initialized.

At t=16, the voltage of the output signal OUT2 increases to the high level. As a result, a voltage at the high level is applied to the gate of the transistor 25-3, thereby turning ON the transistor 25-3. As the transistor 25-3 is turned ON, the potential at the portion between the transistor 21-3 and the transistor 25-3 decreases to the low level, thereby turning OFF the transistor 23-3. Thus, the third group is initialized.

At t=18, the voltage of the output signal OUT3 increases to the high level. As a result, a voltage at the high level is applied to the gate of the transistor 25-4, thereby turning ON the transistor 25-4. As the transistor 25-4 is turned ON, the potential at the portion between the transistor 21-4 and the transistor 25-4 decreases to the low level, thereby turning OFF the transistor 23-4. Thus, the fourth group is initialized. The transistor 21, the transistor 23 and the transistor 25 of each group are initialized as described above. As shown in the portion of FIG. 5 at and after t=16, the transistor 21, the transistor 23 and the transistor 25 of each group repeat the operation performed during the period t=6-16 when transferring new data after they are initialized.

As described above, in the shift register of the present embodiment, the portion between the transistor 3 and the transistor 7 is grounded via the transistor 23 during the period (α) in FIG. 18. As a result, it is possible to prevent the shift register from malfunctioning because of the portion between the transistor 3 and the transistor 7 being in a high-impedance state.

Moreover, in the shift register of the present embodiment, the portion between the transistor 3 and the transistor 7 is not grounded when the transistor 3 and the transistor 7 are ON. As a result, it is less likely that data being transferred is degraded. This will be explained in detail below.

In the first embodiment, the portion between the transistor 3 and the transistor 7 is always grounded via the resistive element 2. Therefore, when data is outputted to the unit circuit 1 of the subsequent block, a portion of the signal charge of the data flows to the ground via the resistive element 2. In contrast, in the shift register of the present embodiment, the transistor 23 is turned OFF when data is outputted to the unit circuit 1 of the subsequent block, whereby the signal charge of the data does not flow to the ground via the transistor 23. As a result, it is less likely that data being transferred is degraded.

Moreover, in the shift register of the present embodiment, the signal outputted from the transistor 3 included in the unit circuit 1 of the preceding block is used when turning OFF the transistor 23, whereby it is not necessary to provide a separate power supply voltage circuit for controlling the transistor 23.

In the shift register of the present embodiment, the drain of the transistor 21 is connected to the portion of the unit circuit 1 of the subsequent block between the transistor 3 and the transistor 7 or to the gate of the transistor 3 of the first block. However, the position to which the drain of the transistor 21 is connected is not limited thereto. For example, a power supply voltage VDD may be applied to the drain of the transistors 21-1 to 21-4, as shown in FIG. 6. In such a case, the voltage of the power supply voltage VDD needs to have such a level that the transistor 21 can be turned ON. Thus, the drain of the transistor 21 always has a potential at the high level. As a result, it is possible to prevent a leak current from flowing from the source of the transistor 21 toward the drain thereof when the transistor 21 is OFF.

Figure 7:
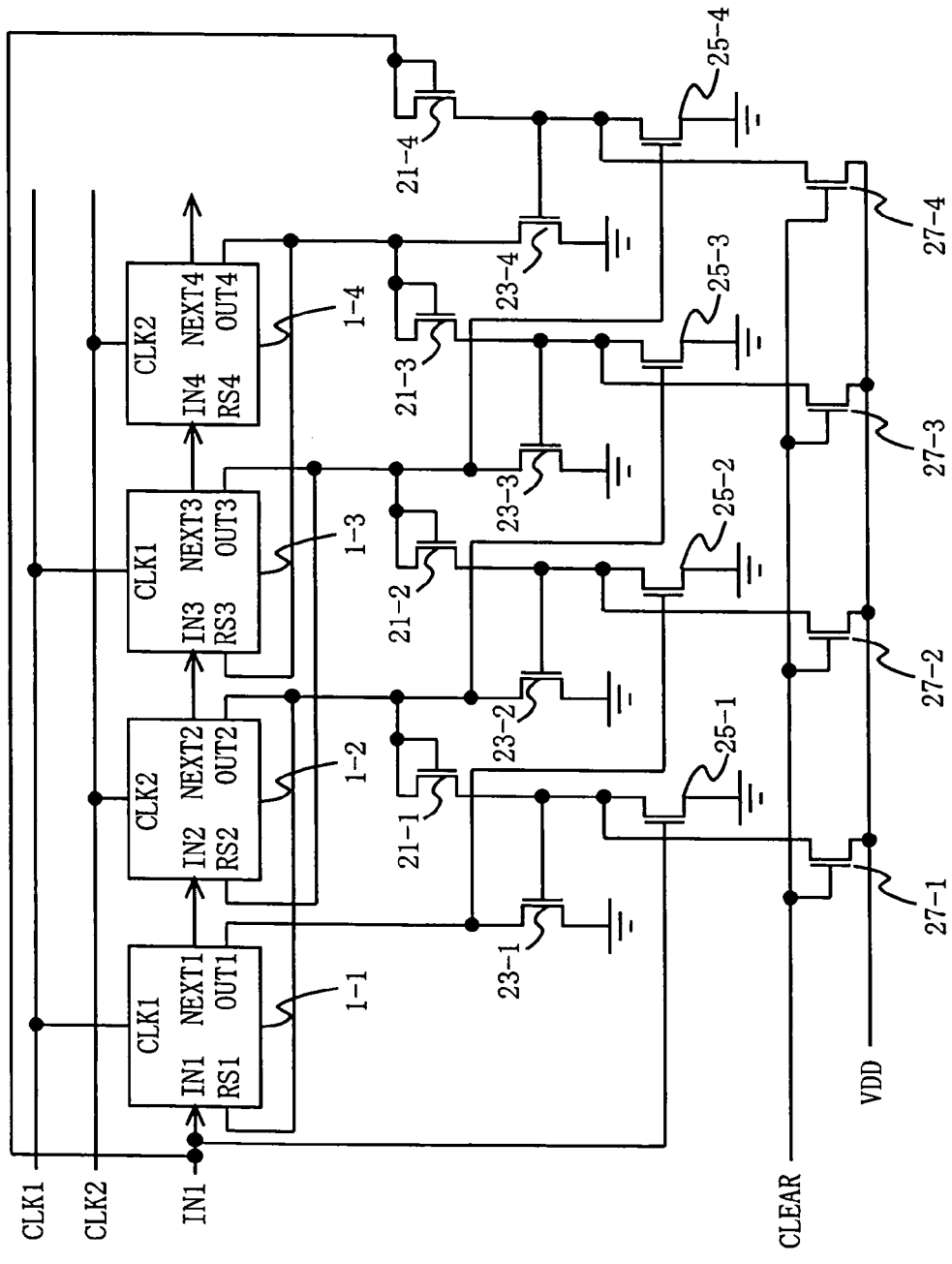
FIG. 7 shows an alternative configuration of the shift register of the second embodiment of the present invention.

Moreover, the shift register of the present embodiment may further include a circuit including transistors 27-1 to 27-4, as shown in FIG. 7. FIG. 7 shows an alternative shift register of the present embodiment. In the shift register shown in FIG. 7, the potential at the portion between the transistor 21 and the transistor 25 is brought to the high level, thereby turning ON the transistor 23, immediately before data is inputted. Thus, the potential at the portion of the unit circuit 1 between the transistor 3 and the transistor 7 is reset to the ground potential. The shift register shown in FIG. 7 will now be described in detail.

The transistor 27 serves to reset the potential at the portion between the transistor 3 and the transistor 7 of the unit circuit 1 to the ground potential based on a signal CLEAR. Specifically, the transistor 27 applies a voltage at the high level to a portion between the transistor 21 and the transistor 25, thereby turning ON the transistor 23. Thus, the portion between the transistor 3 and the transistor 7 is grounded via the transistor 23. In order to realize such an operation, the signal CLEAR is applied to the gate of the transistor 27. The signal CLEAR includes a high-level pulse immediately before data is inputted to the unit circuit 1-1 of the first block. The power supply voltage VDD is applied to the drain of the transistor 27. The source of the transistor 27 is connected to the portion between the transistor 21 and the transistor 25.

The operation of the shift register of FIG. 7 having such a configuration will now be described briefly. First, immediately before data is inputted to the shift register, the level of the signal CLEAR increases to the high level. Thus, the transistors 27-1 to 27-4 are turned ON. When the transistor 27 is turned ON, the portion of the unit circuit 1 between the transistor 3 and the transistor 7 is grounded via the transistor 23. Thus, the potential at the portion of the unit circuit 1 between the transistor 3 and the transistor 7 is reset to the ground potential. Thereafter, the shift register performs an operation as shown in FIG. 5.

As described above, with the shift register shown in FIG. 7, the potential at the portion between the transistor 3 and the transistor 7 can be made stable in the initial state. This will be explained in detail below. In the initial state, the potential at the portion between the transistor 21 and the transistor 25 is unstable, and the state of the transistor 23 is also unstable. Therefore, the potential at the portion between the transistor 3 and the transistor 7 is also unstable.

In the shift register shown in FIG. 7, a voltage at the high level is applied to the portion between the transistor 21 and the transistor 25 immediately before data is inputted. This resolves the unstability of the potential at the portion between the transistor 21 and the transistor 25 in the initial state.

While the signal CLEAR transitions to the high level immediately before data is inputted to the unit circuit 1-1 in the illustrated example, the time at which the signal CLEAR transitions to the high level is not limited thereto. Specifically, the signal CLEAR may alternatively transition to the high level simultaneously with input of the data to the unit circuit 1-1. Alternatively, the signal CLEAR may transition to the high level following power-on. Where the shift register is used in a solid-state image sensor, the signal CLEAR may transition to the high level each time one frame of data of the solid-state image sensor is outputted.

Figure 8:
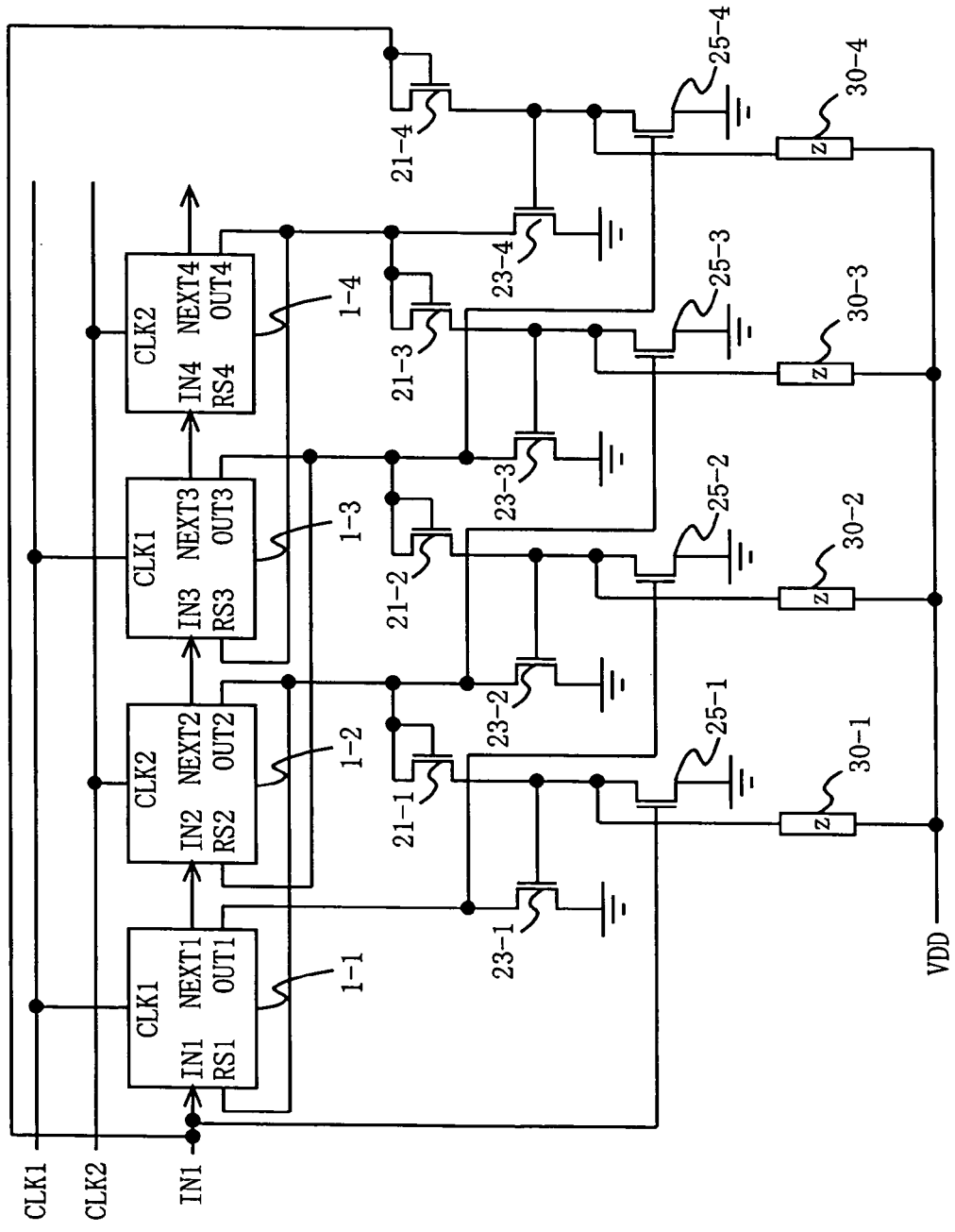
FIG. 8 shows an alternative configuration of the shift register of the second embodiment of the present invention.

Referring to FIG. 8, the shift register may include a resistive element 30 instead of the transistor 27. FIG. 8 shows an alternative shift register of the present embodiment. In the shift register shown in FIG. 8, the power supply voltage VDD is applied to the portion between the transistor 21 and the transistor 25 via the resistive element 30. This prevents a situation where the portion between the transistor 21 and the transistor 25 is brought to a high-impedance state, causing a leak current flowing therefrom, thus lowering the gate voltage of the transistor 23. It is preferred that the resistive element 30 has a resistance value sufficiently larger than that of the transistor 25 when the transistor 25 is ON. This is for preventing a current from flowing toward the resistive element 30 when the transistor 25 is turned ON.

Figure 9:
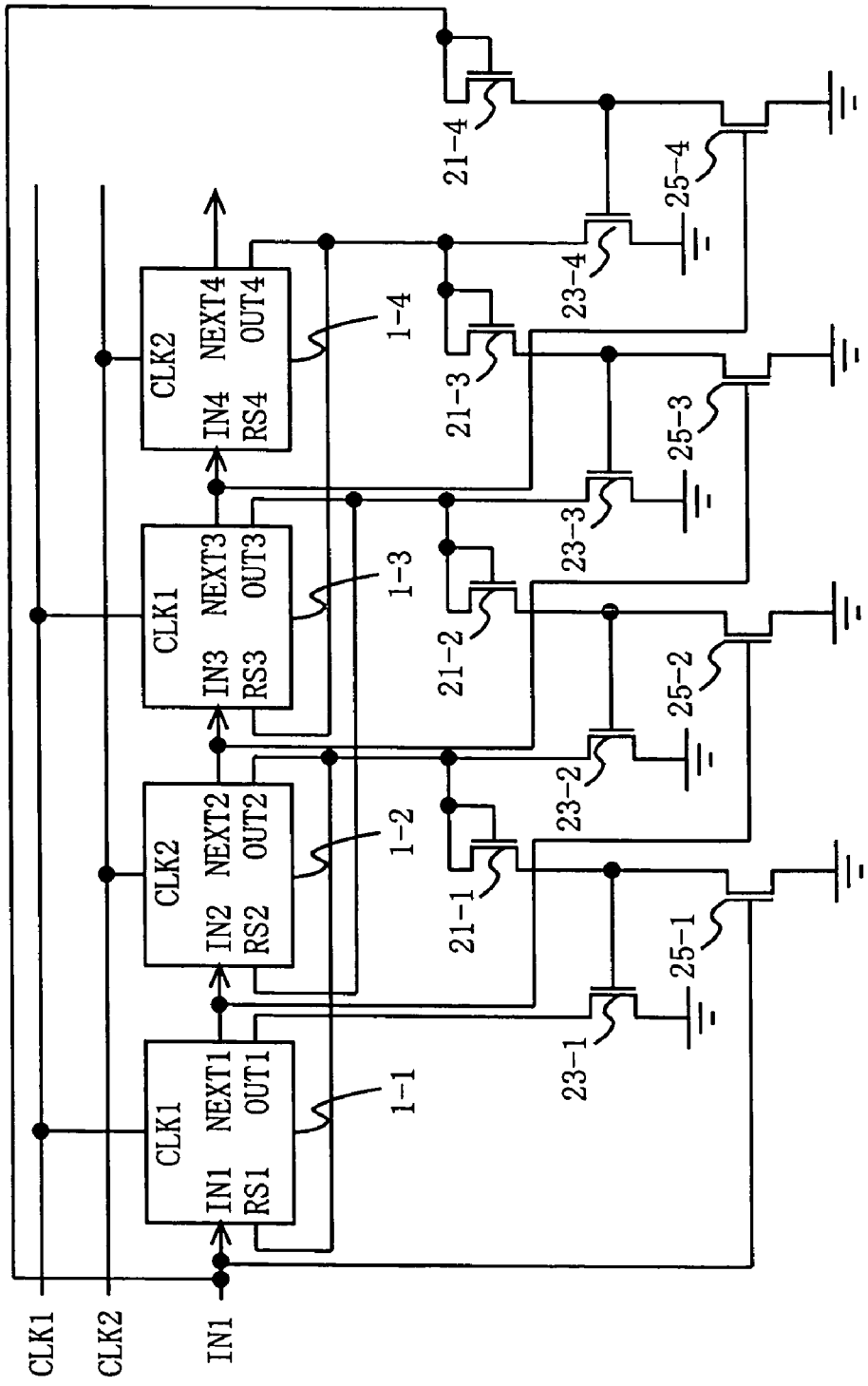
FIG. 9 shows an alternative configuration of the shift register of the second embodiment of the present invention.

In the shift register of the present embodiment shown in FIG. 4, the output signals OUT1 to OUT3 of the unit circuits 1-1 to 1-3 of the preceding blocks are applied to the gates of the transistors 25-2 to 25-4 of the second to last blocks, respectively. However, the signals applied to the gates of the transistors 25-2 to 25-4 of the second to last blocks are not limited thereto. For example, the output signals NEXT1 to NEXT3 of the preceding blocks may be applied to the gates of the transistors 25-2 to 25-4, respectively, as shown in FIG. 9. The output signal NEXT is at the high level for a longer period of time than the output signal OUT, as shown in FIG. 5. Therefore, it is possible to more reliably reset the potential at the portion between the transistor 21 and the transistor 25.

Alternatively, the shift registers of FIG. 7 and FIG. 9 may be combined together, or the shift registers of FIG. 8 and FIG. 9 may be combined together.

Figure 10:
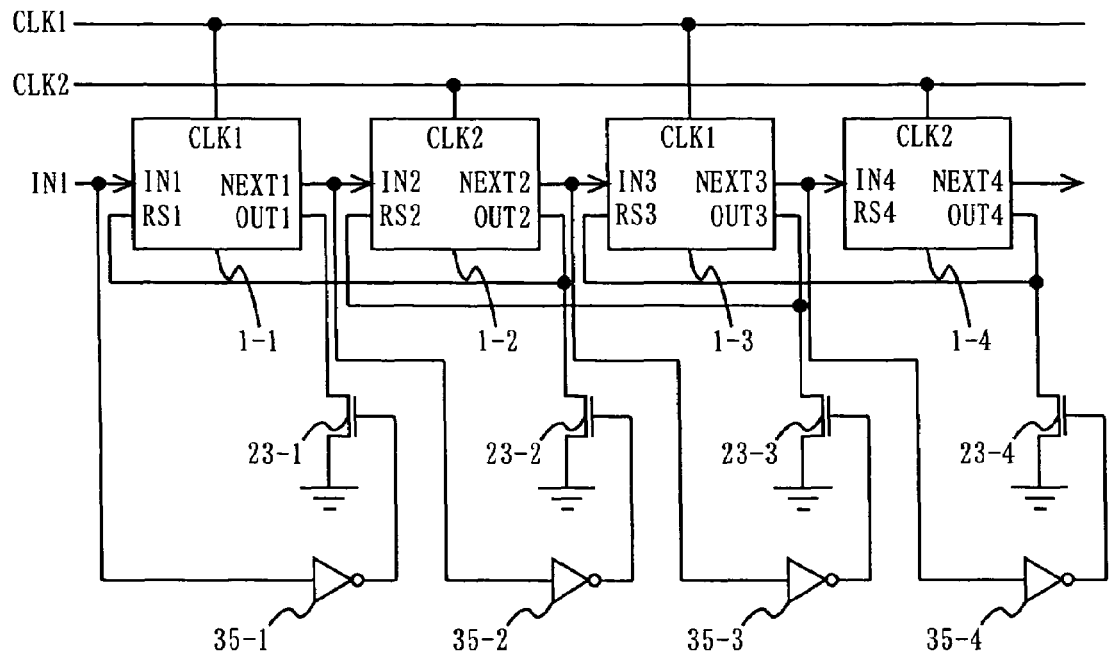
FIG. 10 shows a configuration of a shift register according to a third embodiment of the present invention.

A shift register according to the third embodiment of the present invention will now be described with reference to the drawings. FIG. 10 shows a configuration of the shift register of the present embodiment. The shift register shown in FIG. 10 is obtained by replacing the transistor 21 and the transistor 25 of the shift register shown in FIG. 4 with an inverter 35. The shift register of the present embodiment will now be described in detail with reference to FIG. 10.

Referring to FIG. 10, the shift register includes unit circuits 1-1 to 1-4, transistors 23-1 to 23-4 and inverters 35-1 to 35-4. The unit circuits 1-1 to 1-4 and the transistors 23-1 to 23-4 are similar to those described above in the second embodiment, and will not be further described below.

Figure 11:
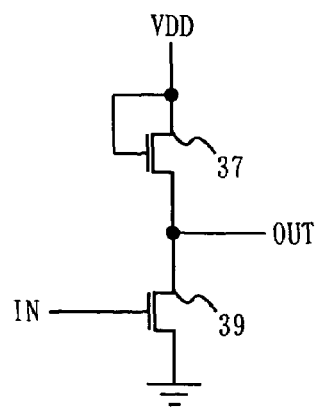
FIG. 11 shows a configuration of an inverter.

One end of the inverter 35 is connected to the gate of the transistor 3 of the corresponding unit circuit 1, and the other end to the gate of the corresponding transistor 23. The inverter 35 is an element that produces a control signal for turning ON/OFF the transistor 23 by using data inputted to the corresponding unit circuit 1, and outputs the inversion of the potential at the gate of the transistor 3. An exemplary configuration of the inverter 35 will now be described with reference to the drawings. FIG. 11 shows a configuration of the inverter 35.

Referring to FIG. 11, the inverter 35 includes a transistor 37 and a transistor 39. The power supply voltage VDD is applied to the gate and the drain of the transistor 37. The source of the transistor 39 is grounded. The source of the transistor 37 and the drain of the transistor 39 are connected to each other, and a control signal for controlling the transistor 23 is outputted from the connected portion. The gate of the transistor 39 is connected to the gate of the transistor 3 of the unit circuit 1.

Figure 12:
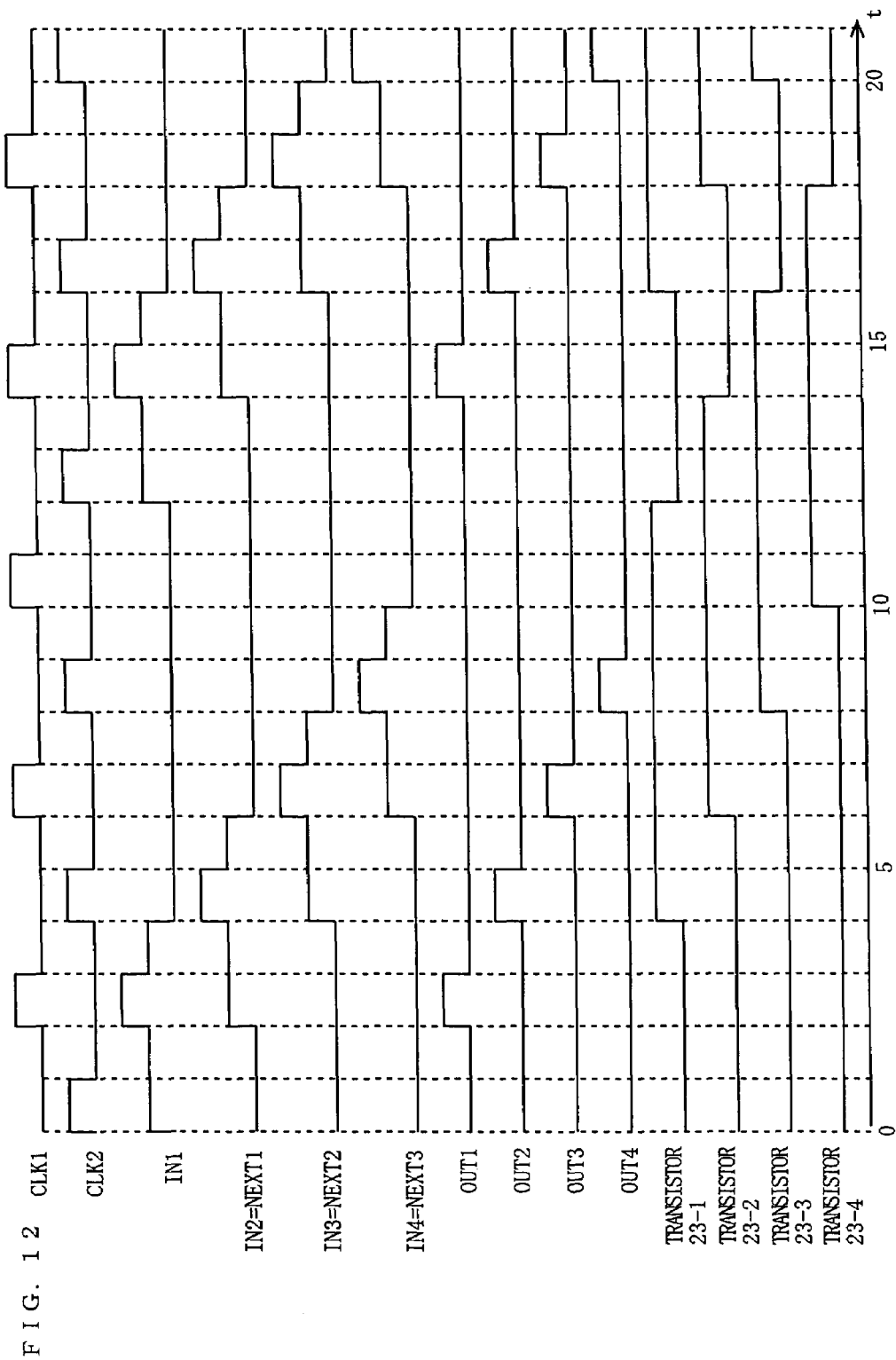
FIG. 12 shows transitions of the levels of various signals and the states of various transistors when the shift register of the third embodiment of the present invention is transferring data.

The operation of the shift register of the present embodiment having such a configuration will now be described with reference to the drawings. FIG. 12 shows transitions of the voltage levels of various signals and the states of the transistors 23 when the shift register shown in FIG. 10 is transferring data. The operation performed by the transistor 3 and the transistor 7 of the unit circuit 1 when the shift register of the present embodiment transfers data is similar to those of the first and second embodiments. Therefore, the following description will focus on the operation of the transistor 23, which is different from those of the first and second embodiments.

First, the transistor 23-1 is turned ON during the periods t=4-12 and t=16-21, and OFF during the periods t=0-4 and t=12-16. This is because the gate potential of the transistor 3 of a unit circuit 1-1 (i.e., the input signal IN1) is at the low level during the periods t=4-12 and t=16-21. During the periods t=4-12 and t=16-21, the transistor 3 and the transistor 7 of the unit circuit 1-1 are both OFF. Therefore, if the transistor 23-1 is turned ON during such periods, the potential at the portion of the unit circuit 1-1 between the transistor 3 and the transistor 7 can stably stay at the ground potential. The transistors 23-2 to 23-4 operate in a similar manner to the transistor 23-1, and the operations of the transistors 23-2 to 23-4 will not be described below.

As described above, in the shift register of the present embodiment, the portion between the transistor 3 and the transistor 7 is grounded via the transistor 23 during the period ($\alpha$) in FIG. 18. As a result, it is possible to prevent the shift register from malfunctioning because of the portion between the transistor 3 and the transistor 7 being in a high-impedance state.

As in the second embodiment, in the shift register of the present embodiment, the portion between the transistor 3 and the transistor 7 is not grounded when the transistor 3 and the transistor 7 are ON. As a result, it is less likely that data being transferred is degraded.

In the shift register of the present embodiment, the transistor 23 is controlled by using the signal inputted to the unit circuit 1 to which it belongs. Thus, the same circuit configuration for controlling the unit circuit 1 can be used for all the unit circuits 1. Using an inverter, it is possible to simplify the configuration of the shift register.

Figure 13:
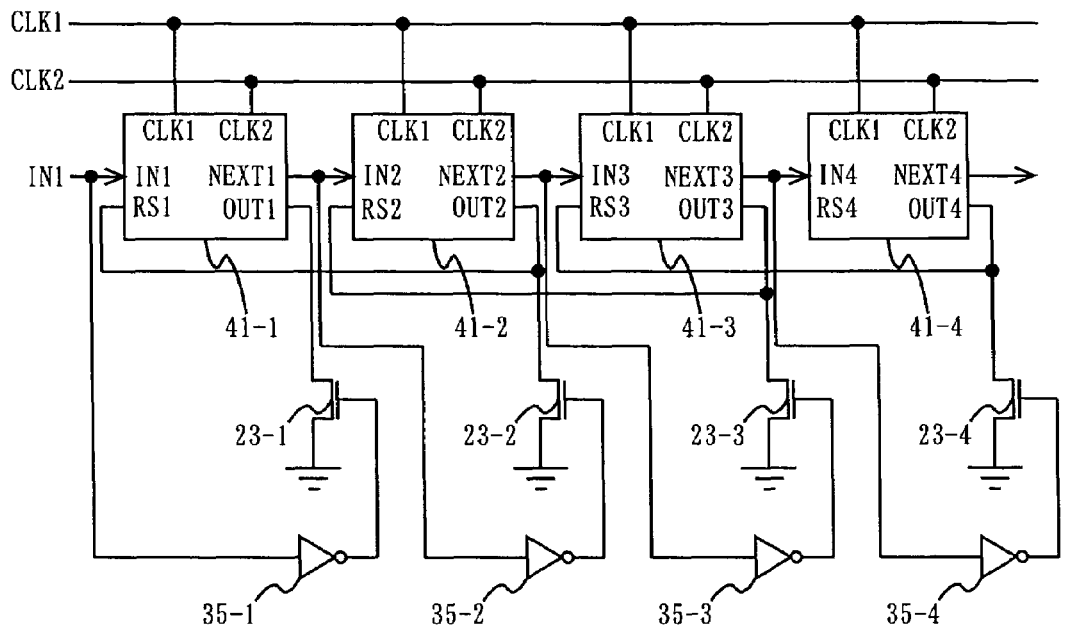
FIG. 13 shows an alternative configuration of the shift register of the third embodiment of the present invention.

In the shift register of the present embodiment, the clock signals CLK1 and CLK2 may be both inputted to each of the unit circuits 41-1 to 41-4, as shown in FIG. 13. FIG. 13 shows a shift register in which the clock signals CLK1 and CLK2 are both inputted to each of the unit circuits 41-1 to 41-4. The shift register shown in FIG. 13 will now be described.

In the shift register shown in FIG. 13, the clock signal CLK1 and the clock signal CLK2 are both inputted to each of the unit circuits 41-1 to 41-4. In the shift register shown in FIG. 13 using two clock signals inputted to each unit circuit as described above, the amount by which the voltage of the input signal IN increases during the period t=2-3 in FIG. 5 is increased. This will be explained in detail below.

Figure 14:
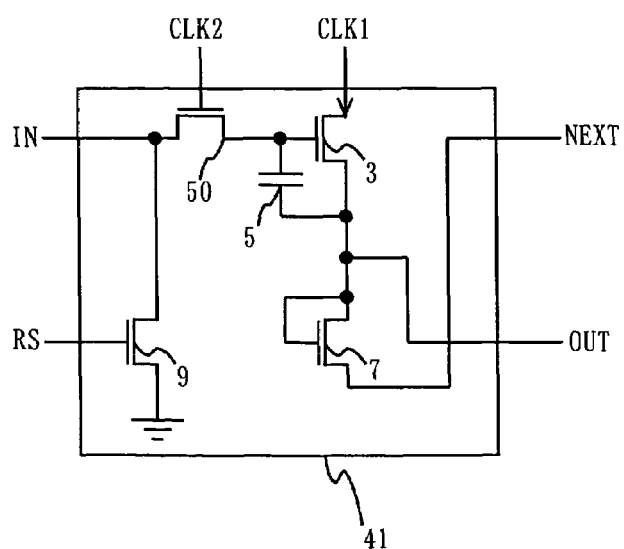
FIG. 14 shows a configuration of a unit circuit in the shift register of the third embodiment of the present invention.

Referring to FIG. 13, the shift register includes unit circuits 41-1 to 41-4, transistors 23-1 to 23-4 and inverters 35-1 to 35-4. The transistors 23-1 to 23-4 and the inverters 35-1 to 35-4 are similar to those shown in FIG. 10, and will not be further described below. The unit circuit 41, which is different from that of the shift register of FIG. 10, will now be described in detail with reference to the drawings. FIG. 14 shows the unit circuit 41 in detail.

The unit circuit 41 shown in FIG. 14 is different from the unit circuit 1 shown in FIG. 17 in that a transistor 50 is additionally provided. The transistor 50 is a switch for turning ON/OFF the connection between the transistor 3 and the transistor 9. The clock signal CLK2 is applied to the gate of the transistor 50. The signal outputted from the unit circuit 41 of the preceding block is inputted to the drain of the transistor 50. The source of the transistor 50 is connected to the gate of the transistor 3. Note that FIG. 14 shows the configuration of a unit circuit 41 of an odd-numbered block. In a unit circuit 41 of an even-numbered block, the clock signal CLK2 is applied to the drain of the transistor 3, and the clock signal CLK1 to the gate of the transistor 50. Other than this, the configuration is similar to those of the first to third embodiments, and thus will not be further described below.

The operation of the shift register of FIG. 14 having such a configuration will now be described with reference to FIG. 12. The operation of the shift register shown in FIG. 14 is basically the same as that of FIG. 12 described above. For the sake of simplicity, the following description will focus on portions of the operation different from that of FIG. 12. In the following description, it is assumed that the unit circuit 41 shown in FIG. 14 is the unit circuit 41-1.

At t=0, data is inputted to the unit circuit 41-1. At this point, the voltage of the clock signal CLK2 increases to the high level, thereby turning ON the transistor 50. Thus, the data passes through the transistor 50 and is stored in the capacitor 5. As a result, the potential at the gate of the transistor 3 (i.e., the input signal IN1) increases to the high level.

At t=1, the voltage of the clock signal CLK2 decreases to the low level, thereby turning OFF the transistor 50.

At t=2, the voltage of the clock signal CLK1 transitions to the high level. Since the transistor 3 of the unit circuit 41-1 is ON, the transistor 3 outputs the clock signal CLK1 having a voltage at the high level via the source thereof. Thus, the voltage of the output signal OUT1 increases to the high level. At this point, the gate of the transistor 3 of the unit circuit 41-1 shown in FIG. 14 is in a high-impedance state. Therefore, if the potential at the lower electrode of the capacitor 5 of the unit circuit 41-1 varies, the potential at the upper electrode of the capacitor 5 of the unit circuit 41-1 (i.e., the gate potential of the transistor 3 of the unit circuit 41-1) also varies. Thus, if the source potential of the transistor 3 of the unit circuit 41-1 (i.e., the voltage of the output signal OUT1) transitions to the high level, the gate potential of the transistor 3 of the unit circuit 41-1 (i.e., the voltage of the input signal IN1) also increases.

In the unit circuit 41-1 shown in FIG. 14, the amount by which the gate potential of the transistor 3 (i.e., the voltage of the input signal) increases at t=2 is greater than that shown in FIG. 17. This will be explained in detail below.

Figure 15A:
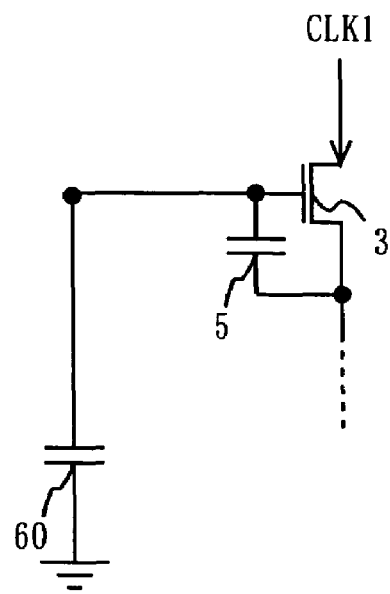

In FIG. 17, the line connected to the gate of the transistor 3 and the transistor 9 can be regarded as a parasitic capacitor. Therefore, the configuration as seen from the source of the transistor 3 includes the capacitor 5 and a parasitic capacitor 60 connected in series with each other as shown in FIG. 15A. Assume that the capacitance of the capacitor 5 is C1, and that of the parasitic capacitor 60 is C2. Also assume that the amount of voltage by which the clock signal CLK1 increases at t=2 is $\Delta V$.

Then, the amount by which the gate potential of the transistor 3 increases is equal to the amount by which the potential at a portion on the left of the capacitor 5 in FIG. 15A increases. Therefore, the amount by which the potential at the gate of the transistor 3 increases is $C1 \cdot \Delta V/(C1+C2)$.

Figure 15B:
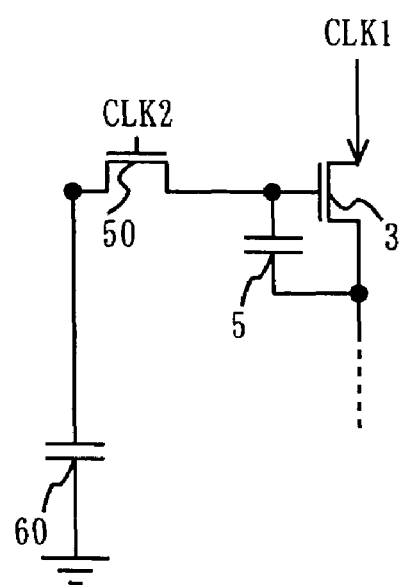
Figure 16:
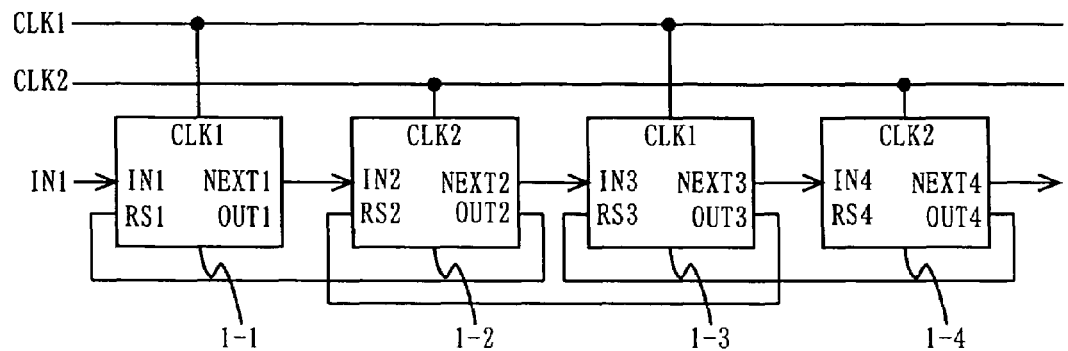
FIG. 16 shows a configuration of a conventional shift register.

In contrast, in the unit circuit 41-1 shown in FIG. 14, the transistor 50 is provided between the capacitor 5 and the parasitic capacitor 60, as shown in FIG. 15B. The transistor 50 is OFF at t=2. Therefore, the presence of the parasitic capacitor 60 located behind the transistor 50 can be ignored. Thus, it can be considered C2=0. As a result, the amount by which the potential at the gate of the transistor 3 increases is $\Delta V$. If the amount by which the gate potential of the transistor 3 increases is increased, the resistance value of the transistor 3 being ON can be lowered.

At and after t=3, the unit circuit 41-1 operates in a similar manner to the unit circuit 1-1, and the operation of the unit circuit 41-1 will not be further described below. The amount by which the gate potential of the transistor 3 increases in the unit circuits 41-2 to 41-4 is the same as that in the unit circuit 41-1, and will not be further described below.

The unit circuit 41-1 as shown in FIG. 14 can be used in any of the shift registers of the first to third embodiments.

As in the first embodiment, the shift registers of the second and third embodiments are preferably used in a vertical shift register or a horizontal shift register of a MOS-type solid-state image sensor. Moreover, as in the first embodiment, a MOS-type solid-state image sensor including the shift register of the second or third embodiment is preferably used in a digital still camera.

It is assumed in the first to third embodiments that the transistors are N-channel MOS transistors. However, the transistors may alternatively be P-channel MOS transistors. In such a case, the high level and the low level are reversed for the voltages and the potentials. Moreover, the power supply voltage VDD is applied to each position grounded in the figures.

In the first to third embodiments, it is assumed that data is transferred block by block. However, the manner in which data is transferred is not limited thereto. For example, data may be transferred while skipping every other block as long as it is transferred through the shift register downstream in the data transfer direction.

While the invention has been described in detail, the foregoing description is in all aspects illustrative and not restrictive. It is understood that numerous other modifications and variations can be devised without departing from the scope of the invention.

What is claimed is:

1. A shift register, comprising a plurality of blocks of unit circuits for transferring data in one direction based on a clock signal having pulses, each unit circuit including:

capacitor means for storing the data outputted from a unit circuit upstream in a data transfer direction;

a first transistor including an input-side diffusion layer and an output-side diffusion layer, wherein the first transistor receives a clock signal via the input-side diffusion layer, and the first transistor is turned ON only when the data is being stored in the capacitor means so as to output a pulse of the clock signal via the output-side diffusion layer;

a second transistor including a control electrode, an input-side diffusion layer and an output-side diffusion layer, wherein the control electrode and the input-side diffusion layer are connected to the output-side diffusion layer of the first transistor, and the second transistor is turned ON only when the pulse of the clock signal from the first transistor is inputted to the control electrode and the input-side diffusion layer so as to output the data via the output-side diffusion layer to a unit circuit downstream in the data transfer direction; and potential controlling means for controlling a potential at the control electrode of the second transistor to be such a potential that the second transistor is kept OFF at least during a period in which the second transistor is supposed to be OFF, wherein:

the potential controlling means includes a fifth transistor including a control electrode, an input-side diffusion layer, and an output-side diffusion layer, the input-side diffusion layer is connected to a portion between the output-side diffusion layer of the first transistor and the control electrode of the second transistor, a predetermined voltage is applied to the output-side diffusion layer, and a control signal for turning ON/OFF the fifth transistor is applied to the control electrode of the fifth transistor, the fifth transistor is controlled by the control signal so that the fifth transistor is ON during a period in which the first transistor and the second transistor are OFF after the data is outputted to a unit circuit downstream in the data transfer direction, the potential controlling means includes control signal producing means for producing the control signal by using a pulse of the clock signal outputted from the output-side diffusion layer of the first transistor included in the unit circuit downstream in the data transfer direction, the control signal producing means is a sixth transistor including a control electrode, an input-side diffusion layer, and an output-side diffusion layer, wherein the input-side diffusion layer and the control electrode are connected to the output-side diffusion layer of the first transistor included in the unit circuit downstream in the data transfer direction, and the output-side diffusion layer is connected to the control electrode of the fifth transistor, the sixth transistor is turned ON when a pulse of the clock signal outputted from the first transistor included in the unit circuit downstream in the data transfer direction is applied to the control electrode and the input-side diffusion layer of the sixth transistor, and the fifth transistor is turned ON when the sixth transistor is turned ON.

2. The shift register according to claim 1, wherein each unit circuit further includes erasing means for erasing the data stored in the capacitor means after the data is outputted from the unit circuit.

3. The shift register according to claim 2, wherein:

the erasing means is a third transistor including a control electrode, an input-side diffusion layer and an output-side diffusion layer, wherein a predetermined voltage is applied to the output-side diffusion layer, the input-side diffusion layer is connected to the control electrode of the first transistor, and the control electrode is connected to a portion of a unit circuit downstream in the data transfer direction between the output-side diffusion layer of the first transistor and the control electrode of the second transistor; and the third transistor is turned ON when a pulse of the clock signal is outputted from the output-side diffusion layer of the first transistor included in the unit circuit downstream in the data transfer direction so as to erase the data stored in the capacitor means.

4. The shift register according to claim 1, wherein the control signal producing means further includes turn-OFF means for changing the potential at the control electrode of the fifth transistor so as to turn OFF the fifth transistor when the data is outputted from a unit circuit upstream in the data transfer direction.

5. The shift register according to claim 4, wherein:

the turn-OFF means is a seventh transistor including a control electrode, an input-side diffusion layer and an output-side diffusion layer, wherein the input-side diffusion layer is connected to the output-side diffusion layer of the sixth transistor, the control electrode is connected to the output-side diffusion layer of the first transistor included in the unit circuit upstream in the data transfer direction, and a predetermined voltage is applied to the output-side diffusion layer;

the seventh transistor is turned ON only when a pulse of the clock signal outputted from the first transistor of the unit circuit upstream in the data transfer direction is applied to the control electrode of the seventh transistor; and the fifth transistor is turned OFF when the seventh transistor is turned ON.

6. The shift register according to claim 1, wherein the potential controlling means of the unit circuit of a last block among the plurality of blocks of unit circuits further includes control signal producing means for producing the control signal by using the data inputted to a unit circuit upstream in the data transfer direction.

7. A MOS-type solid-state image sensor, comprising:
- a plurality of light-receiving elements arranged in a matrix pattern each for converting incident light into a signal charge, which is data;
- a plurality of signal lines provided between columns of the light-receiving elements arranged in a matrix pattern for reading out the data;
- a plurality of column selection transistors each corresponding to one of the plurality of signal lines and each having an input-side diffusion layer connected to the corresponding signal line; and
- a shift register according to claim 1 including a plurality of blocks of unit circuits for transferring the data in one direction based on a clock signal having pulses, wherein each unit circuit includes:
- capacitor means for storing the data outputted from a unit circuit upstream in a data transfer direction;
- a first transistor including an input-side diffusion layer and an output-side diffusion layer, wherein the first transistor receives a clock signal via the input-side diffusion layer, and the first transistor is turned ON only when the data is being stored in the capacitor means so as to output a pulse of the clock signal via the output-side diffusion layer;
- a second transistor including a control electrode, an input-side diffusion layer and an output-side diffusion layer, wherein the control electrode and the input-side diffusion layer are connected to the output-side diffusion layer of the first transistor, and the second transistor is turned ON only when the pulse of the clock signal from the first transistor is inputted to the control electrode and the input-side diffusion layer so as to output the data via the output-side diffusion layer to a unit circuit downstream in the data transfer direction; and
- potential controlling means for controlling a potential at the output-side diffusion layer of the first transistor to be such a potential that the column selection transistor is kept OFF at least during a period in which the second transistor is supposed to be OFF, wherein:
- each column selection transistor includes a control electrode connected to the output-side diffusion layer of the first transistor, and is turned ON when a pulse is outputted from the output-side diffusion layer of the first transistor; and
- the shift register, while transferring the data in one direction, applies a pulse from the first transistor of each unit circuit to the control electrode of the corresponding column selection transistor, whereby the column selection transistors are turned ON successively so as to output the data to an outside via the plurality of signal lines.

8. A MOS-type solid-state image sensor, comprising:
- a plurality of light-receiving elements arranged in a matrix pattern each for converting incident light into a signal charge, which is data;
- a plurality of signal lines provided between rows of the light-receiving elements arranged in a matrix pattern each for selecting a row;
- a plurality of row selection transistors each corresponding to one of the plurality of signal lines and each having an input-side diffusion layer connected to the corresponding signal line; and
- a shift register according to claim 1 including a plurality of blocks of unit circuits for transferring the data in one direction based on a clock signal having pulses, wherein each unit circuit includes:
- capacitor means for storing the data outputted from a unit circuit upstream in a data transfer direction;
- a first transistor including an input-side diffusion layer and an output-side diffusion layer, wherein the first transistor receives a clock signal via the input-side diffusion layer, and the first transistor is turned ON only when the data is being stored in the capacitor means so as to output a pulse of the clock signal via the output-side diffusion layer;
- a second transistor including a control electrode, an input-side diffusion layer and an output-side diffusion layer, wherein the control electrode and the input-side diffusion layer are connected to the output-side diffusion layer of the first transistor, and the second transistor is turned ON only when the pulse of the clock signal from the first transistor is inputted to the control electrode and the input-side diffusion layer so as to output the data via the output-side diffusion layer to a unit circuit downstream in the data transfer direction; and
- potential controlling means for controlling a potential at the output-side diffusion layer of the first transistor to be such a potential that the row selection transistor is kept OFF at least during a period in which the second transistor is supposed to be OFF, wherein:
- each row selection transistor includes a control electrode connected to the output-side diffusion layer of the first transistor, and is turned ON when a pulse is outputted from the output-side diffusion layer of the first transistor; and
- the shift register, while transferring the data in one direction, applies a pulse from the first transistor of each unit circuit to the control electrode of the corresponding row selection transistor, whereby the row selection transistors are turned ON successively so as to successively select the plurality of signal lines.

9. A camera, comprising:
- a plurality of light-receiving elements arranged in a matrix pattern each for converting incident light into a signal charge, which is data;
- a plurality of signal lines provided between columns of the light-receiving elements arranged in a matrix pattern for reading out the data;
- a plurality of column selection transistors each corresponding to one of the plurality of signal lines and each having an input-side diffusion layer connected to the corresponding signal line;
- a shift register according to claim 1 including a plurality of blocks of unit circuits for transferring the data in one direction based on a clock signal having pulses; and
- an external circuit for performing a predetermined operation on the data transferred by the shift register, wherein each unit circuit includes:
- capacitor means for storing the data outputted from a unit circuit upstream in a data transfer direction;
- a first transistor including an input-side diffusion layer and an output-side diffusion layer, wherein the first transistor receives a clock signal via the input-side diffusion layer, and the first transistor is turned ON only when the data is being stored in the capacitor means so as to output a pulse of the clock signal via the output-side diffusion layer;
- a second transistor including a control electrode, an input-side diffusion layer and an output-side diffusion layer, wherein the control electrode and the input-side diffusion layer are connected to the output-side diffusion layer of the first transistor, and the second transistor is turned ON only when the pulse of the clock signal from the first transistor is inputted to the control electrode and the input-side diffusion layer so as to output the data via the output-side diffusion layer to a unit circuit downstream in the data transfer direction; and potential controlling means for controlling a potential at the output-side diffusion layer of the first transistor to be such a potential that the column selection transistor is kept OFF at least during a period in which the second transistor is supposed to be OFF, wherein:

each column selection transistor includes a control electrode connected to the output-side diffusion layer of the first transistor, and is turned ON when a pulse is outputted from the output-side diffusion layer of the first transistor; and the shift register, while transferring the data in one direction, applies a pulse from the first transistor of each unit circuit to the control electrode of the corresponding column selection transistor, whereby the column selection transistors are turned ON successively so as to output the data to the external circuit via the plurality of signal lines.

10. A camera, comprising:

a plurality of light-receiving elements arranged in a matrix pattern each for converting incident light into a signal charge, which is data;

a plurality of signal lines provided between rows of the light-receiving elements arranged in a matrix pattern each for selecting a row;

a plurality of row selection transistors each corresponding to one of the plurality of signal lines and each having an input-side diffusion layer connected to the corresponding signal line;

a shift register according to claim 1 including a plurality of blocks of unit circuits for transferring the data in one direction based on a clock signal having pulses; and an external circuit for performing a predetermined operation on the data transferred by the shift register, wherein each unit circuit includes:

capacitor means for storing the data outputted from a unit circuit upstream in a data transfer direction;

a first transistor including an input-side diffusion layer and an output-side diffusion layer, wherein the first transistor receives a clock signal via the input-side diffusion layer, and the first transistor is turned ON only when the data is being stored in the capacitor means so as to output a pulse of the clock signal via the output-side diffusion layer;

a second transistor including a control electrode, an input-side diffusion layer and an output-side diffusion layer, wherein the control electrode and the input-side diffusion layer are connected to the output-side diffusion layer of the first transistor, and the second transistor is turned ON only when the pulse of the clock signal from the first transistor is inputted to the control electrode and the input-side diffusion layer so as to output the data via the output-side diffusion layer to a unit circuit downstream in the data transfer direction; and potential controlling means for controlling a potential at the output-side diffusion layer of the first transistor to be such a potential that the row selection transistor is kept OFF at least during a period in which the second transistor is supposed to be OFF, wherein:

each row selection transistor includes a control electrode connected to the output-side diffusion layer of the first transistor, and is turned ON when a pulse is outputted from the output-side diffusion layer of the first transistor; and the shift register, while transferring the data in one direction, applies a pulse from the first transistor of each unit circuit to the control electrode of the corresponding row selection transistor, whereby the row selection transistors are turned ON successively so as to successively select the plurality of signal lines.

* * * * *